(12) United States Patent
Io

(10) Patent No.: US 6,344,386 B1
(45) Date of Patent: Feb. 5, 2002

(54) METHOD FOR FABRICATING SEMICONDUCTOR DEVICE INCLUDING MEMORY CELL REGION AND CMOS LOGIC REGION

(75) Inventor: Eiji Io, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/515,859

(22) Filed: Feb. 29, 2000

(30) Foreign Application Priority Data

Mar. 4, 1999 (JP) .......................................... 11-057126

(51) Int. Cl.$^7$ .......................................... H01L 21/8234
(52) U.S. Cl. ...................................................... 438/238
(58) Field of Search ................................. 438/257, 258, 438/275, 651, 652, 660, 664, 671, 238, 229–233

(56) References Cited

U.S. PATENT DOCUMENTS

| | | | | | |
|---|---|---|---|---|---|
| 5,792,684 | A | * | 8/1998 | Lee et al. | 438/238 |
| 6,037,222 | A | * | 6/2000 | Huang et al. | 438/257 |
| 6,074,915 | A | * | 6/2000 | Chen et al. | 438/258 |
| 6,211,548 | B1 | * | 4/2001 | Ma | 257/321 |

* cited by examiner

Primary Examiner—David Nelms
Assistant Examiner—Quoc Hoang
(74) Attorney, Agent, or Firm—McGinn & Gibb, PLLC

(57) ABSTRACT

A CMOS transistor and a memory cell transistor are formed without causing deterioration to reliability and performance. A step of covering a memory cell region with an HTO film and forming sidewalls in the CMOS transistor while exposing a diffusion region of the CMOS transistor, a step of depositing titanium, and a step of reacting the diffusion region with the titanium, forming a titanium silicide in the CMOS, transistor source and drain are provided.

17 Claims, 38 Drawing Sheets

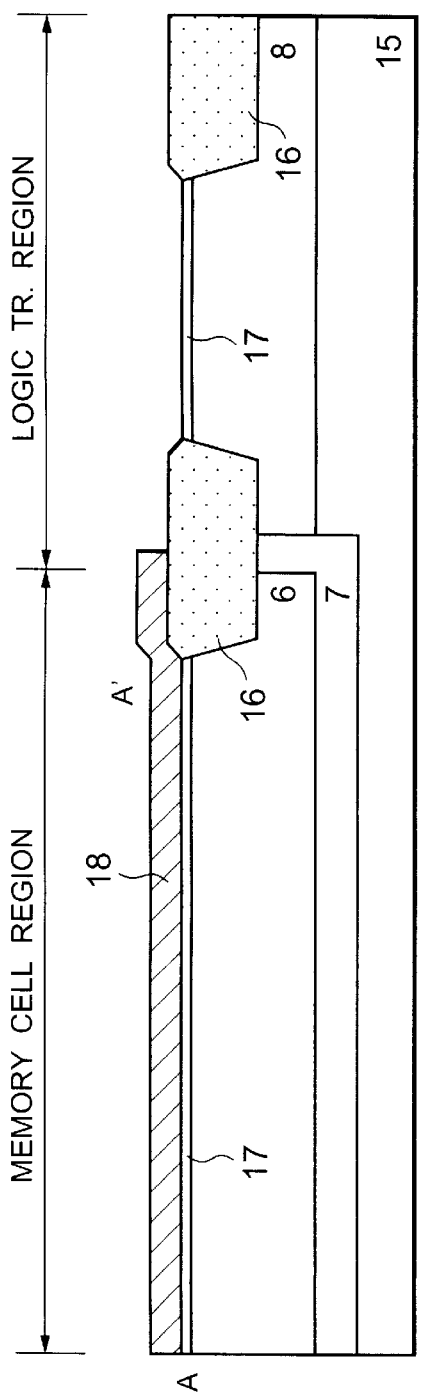
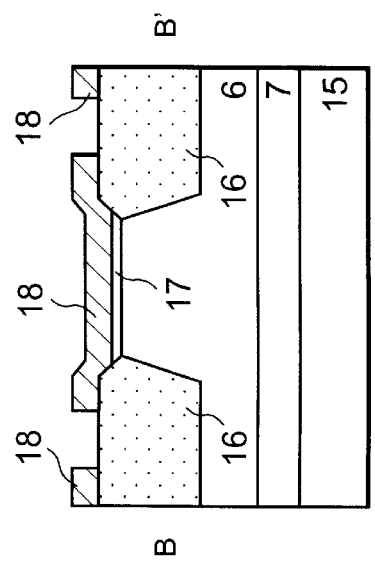
Fig.4(a)
Fig.4(b)

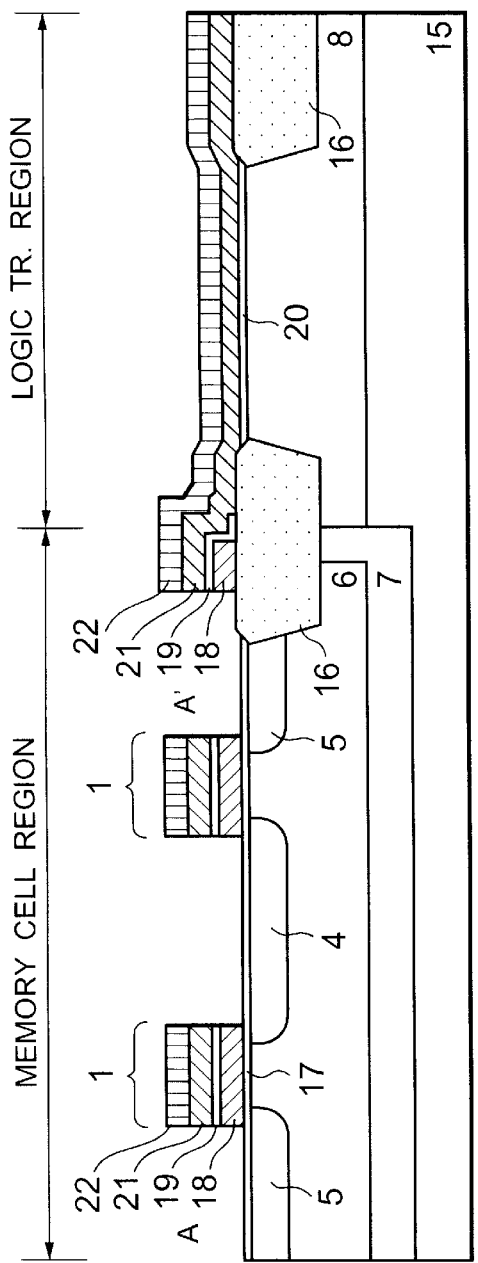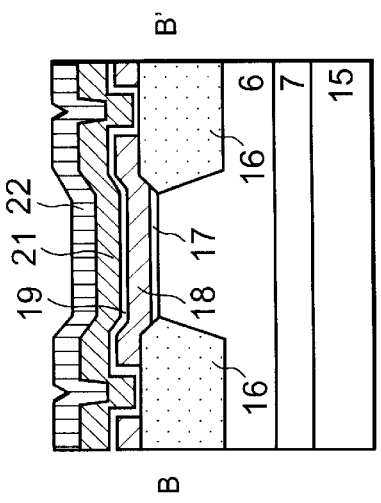
Fig.11(a)
Fig.11(b)

|  | SOURCE VOLTAGE | SELECTED GATE VOLTAGE | CONTROL GATE VOLTAGE | DRAIN VOLTAGE | WELL VOLTAGE |
| --- | --- | --- | --- | --- | --- |
| WRITING STATE | OPEN | 0V | -9V | 6V | 0V |
| ERASING STATE | -4V | 0V | 11V | OPEN | -4V |
| READING STATE | 0V | VCC | VCC | 1V | 0V |

Fig.32

METHOD FOR FABRICATING SEMICONDUCTOR DEVICE INCLUDING MEMORY CELL REGION AND CMOS LOGIC REGION

BACKGROUND OF THE INVENTION

1. Field of the Invention

The present invention relates to a method for fabricating a semiconductor device including a CMOS logic circuit and a non-volatile memory cell, especially to a method for fabricating a semiconductor device including a CMOS logic circuit and a non-volatile memory cell, which includes a step of performing silicidation of a diffusion layer.

2. Description of the Related Art

In recent years, semiconductor devices fabricated with a non-volatile memory cell and a CMOS logic circuit within one chip, in order to increase integration and decrease cost, have been in the spotlight. Reductions in the number of steps and in the cost are realized by making the respective processes common type of consolidated non-volatile memory cell and CMOS circuit chip.

A first conventional example, in which a transistor diffusion layer structuring a CMOS logic circuit and a transistor diffusion layer structuring a non-volatile memory cell circuit are both silicidated, and a second conventional example, in which the two diffusion layers are not silicidated, are used in the conventional consolidation processes.

The first conventional technique is explained while referring to FIG. 27.

A transistor formed in a logic Tr region is prepared with an N-type diffusion layer 64, which becomes a source and a drain, in a P-well 45 formed inside a P-type semiconductor substrate 49, and a lightly doped drain (LDD) 63 formed in correspondence with the diffusion layer 64. A polysilicon gate electrode 65 formed through a gate insulating film 54, a tungsten silicide (WSi) 56 formed on the gate electrode 65, sidewalls 57 covering the side faces of the gate electrode 65 and the WSi 56, and a titanium silicide (TiSi) formed on the diffusion layer 64 are prepared on a channel region sandwiched by the diffusion layer 64, and there is contact to an upper layer Al wiring 60 through a contact electrode 47.

In addition, a memory cell 38 formed in a memory cell region is structured and prepared with an N-well 44 formed in order to provide separation from the P-well 45 in which the above CMOS transistor is formed, a P-well 43 formed in the N-well 44, an N-type drain diffusion layer 41 and an N-type source diffusion layer 42 formed inside the P-well 43, a TiSi 58 formed inside the drain diffusion layer 41 and the source diffusion layer 42, a polysilicon floating gate 39 formed through an insulating film 51 on a channel region formed by the drain diffusion layer 41 and the source diffusion layer 42, a polysilicon control gate 40 formed through an insulating film 53 formed on the floating gate 39, the WSi 56 formed on the control gate 40, and sidewalls 57 formed covering the side faces of the floating gate 39, the insulating film 53, the control gate 40, and the WSi 56. The drain diffusion layer 41 is connected to the upper layer Al wiring 60 through a drain contact 46.

The realization of a high performance CMOS logic circuit is the objective in the first conventional technique, so it is necessary to form the TiSi 58 in order to reduce the resistance of the diffusion layer 64 of the CMOS transistor and increase the operating speed. However, if the TiSi is formed on the diffusion layer 64, which contains impurities of a high concentration, aggregations of silicide develop, and the layer resistance is scattered, so the diffusion layer concentration in the CMOS transistor diffusion layer 64 must be reduced. The CMOS transistor diffusion layer formation processes and the memory cell diffusion layer formation processes are common here, so the memory cell diffusion layer concentration becomes weak, a depletion develops when programming to the memory cell transistor, and the program speed drops. Therefore, the operating speed of the CMOS transistor can be increased with the first conventional technique, but on the other hand, it has a problem in which the operating speed of the memory cell transistor drops.

The second conventional technique is explained next, referring to FIG. 28.

The second conventional technique differs from the first conventional technique in the point that the TiSi is not formed in the diffusion layer 64 of the CMOS transistor, and in the diffusion layers forming the source 41 and the drain 42 of the memory cell transistor, and the point that the concentration is set high in these diffusion layers, while other points are nearly identical. The TiSi cannot be formed here because the diffusion layer concentration is set high, and because there is the problem, as stated above, that aggregation of silicide occurs. Therefore, by increasing the diffusion layer concentration of the source 41 and the drain 42 of the memory cell transistor, the memory cell programming speed can be increased, but on the other hand, there is a problem in which the operating speed of the CMOS transistor drops because its diffusion layer cannot be made low resistance.

From the first and second conventional techniques, it can be considered that by protecting the memory cell region from silicide processes, and by making the diffusion layer electrodes separately, the performance of the memory cell transistor and the CMOS transistor will be increased. However, in order to protect from normal silicide processes, two photolithography steps, and mask material growth and etching steps are necessary. In addition, apertures are formed in the diffusion layer of the CMOS transistor, so the width of the CMOS transistor sidewalls changes after removing the mask material. A detailed explanation of these processes is given below using FIGS. 29 to 31.

First, in order to form a TiSi layer, three steps are necessary. Step 1: making the diffusion layer surface amorphous by ion implantation of arsenic, etc.; step 2: sputtering titanium; and step 3: heat treatment. Of these, it is not possible to eliminate the heat treatment of step 3, so the other two are considered. Titanium is formed on the diffusion layer by step 2 by eliminating only the amorphous making step 1 by eliminating only the amorphous making step 1, so the formation of TiSi cannot be completely prevented. Furthermore, arsenic or the like is ion implanted on the diffusion layer by step 1 by eliminating only the titanium sputtering step 2, so the diffusion layer impurity distribution is broken down. Therefore, in order to prevent the formation of TiSi, it is necessary to mask process both the amorphous making step 1 and the titanium sputtering step 2.

Therefore, in order to selectively perform step 1, making the surface of the diffusion layer 64 amorphous, a photoresist 61 is selectively formed to cover the memory cell region as shown in FIG. 29, and arsenic ion implantation is performed. However, a through film 48 is formed from an oxide film in order to prevent undesirable destruction of the crystal structure by ion implantation, and in order to control the dose amount.

Next, in order to perform the titanium sputtering step 2, after removal of the photoresist 61, a mask oxidation film 66 which is between 500 and 1000 angstroms thicker than the through film 48 is formed as shown in FIG. 3C as a protection film corresponding to the titanium sputtering. The mask oxidation film 66 is selectively etched, and a photoresist 62 is formed in order to expose the diffusion region 64, and the mask oxidation film 66 is left on the memory cell region, as shown in FIG. 3I. When etching the mask oxidation film 66, the width of the sidewalls 57 gets larger for the case of plasma etching being used, and the controllability of the sidewalls 57 deteriorates for the case of wet etching being used. The use of plasma etching is explained here. The mask oxidation film 60 formed by plasma etching is used as a mask for titanium sputtering, and titanium grows on the exposed diffusion region 64. Heat treatment is performed afterward, and titanium and silicon are reacted, turning into a silicide. Un-reacted titanium is etched, forming a TiSi layer 58 selectively on the diffusion layer 64.

Thus not only is there an increase in the process steps for the case of selectively making TiSi only in the CMOS transistor source and drain, the CMOS transistor sidewalls also become wider or the controllability of the sidewall width deteriorates, so a problem develops in which the reliability of the CMOS transistor deteriorates.

SUMMARY OF THE INVENTION

An object of the present invention, therefore, is to provide a process of forming a consolidated non-volatile memory cell and CMOS transistor without deteriorating the reliability and performance of each device.

A method of manufacturing a semiconductor device according to the present invention is characterized by having:

- a step of forming a semiconductor substrate having a memory cell region in which a memory cell transistor is formed, and a CMOS logic region in which a CMOS transistor is formed, and of forming a gate electrode used by the memory cell transistor in the memory cell region;
- a first impurity injection step of forming a diffusion layer in the memory cell region, with the gate electrode used by the memory cell transistor as a mask;
- a step of forming a gate electrode used by the CMOS transistor in the CMOS logic region;
- a second impurity injection step of forming a lightly doped drain in the CMOS logic region, with the gate electrode used by the CMOS transistor as a mask;
- an insulating film formation step of forming an insulating film covering the memory cell region and the CMOS logic region;
- a step of forming a mask layer to cover the memory cell region, excluding the CMOS logic region;
- a step of selectively etching the insulating film in correspondence with the mask layer, and forming sidewalls in the side faces of the gate electrode used by the CMOS transistor;
- a third impurity injection step of forming a diffusion layer of the CMOS transistor in the CMOS logic region, with the sidewalls as a mask;
- a step of depositing a metal on the entire surface after removing the mask layer; and
- a step of reacting the deposited metal and the exposed diffusion layer of the CMOS transistor to form a metal silicide.

In addition, according to a second aspect of the present invention, a method of manufacturing a semiconductor device is characterized by having:

- a step of forming a semiconductor substrate having a memory cell region in which a memory cell transistor is formed, and a CMOS logic region in which a CMOS transistor is formed, and of forming a gate electrode used by the memory cell transistor in the memory cell region;
- a first mask step of selectively masking one region selected from a region in which a source of the memory cell transistor must be formed, and a region in which a drain of the memory cell transistor must be formed;
- a first impurity injection step of forming a first diffusion layer in the non-selected region;
- a step of removing the mask formed by the first mask step;
- a step of forming a gate electrode used by the CMOS transistor in the CMOS logic region;
- a second mask step of selectively masking the non-selected region of the memory cell region;
- a second impurity injection step of forming a lightly doped drain in the CMOS logic region, with the gate electrode used by the CMOS transistor as a mask, together with forming a lightly doped drain region in the selected region of the memory cell region, with the mask formed by the second mask step as a mask;
- a step of removing the mask formed by the second mask step;
- an insulating film formation step of forming an insulating film covering the memory cell region and the CMOS logic region;
- a step of forming a mask layer to cover the other region of the memory cell region, excluding the CMOS logic region and the selected region of the memory cell region;
- a step of selectively etching the insulating film in correspondence to the mask layer, and forming sidewalls in the side faces of the gate electrode used by the CMOS transistor and in one side face of the memory cell transistor;
- a third impurity injection step of forming a diffusion layer of the CMOS transistor in the CMOS logic region, and a second diffusion layer of the memory cell transistor in the other region of the memory cell region, with the sidewalls as a mask;
- a step of depositing a metal on the entire surface after removing the mask layer; and
- a step of reacting the deposited metal with the exposed diffusion layer of the CMOS transistor and with the exposed second diffusion layer of the memory cell transistor to form a metal silicide.

In addition, according to a third aspect of the present invention, a method of manufacturing a semiconductor device is characterized by having:

- a step of forming a semiconductor substrate having a memory cell region in which a memory cell transistor is formed, and a CMOS logic region in which a CMOS transistor is formed, and of forming a gate electrode used by the memory cell transistor in the memory cell region;
- a first mask step of selectively masking a portion of a region in which a drain of the memory cell transistor must be formed;
- a first impurity injection step of forming a first diffusion layer in remaining regions, excluding the masked region;
- a step of removing the mask formed by the first mask step;

a step of forming a gate electrode used by the CMOS transistor in the CMOS logic region;

a second mask step of selectively masking the remaining regions of the memory cell region;

a second impurity injection step of forming a lightly doped drain in the CMOS logic region, with the gate electrode used by the CMOS transistor as a mask, together with forming a lightly doped drain region in the selected region of the memory cell region, in correspondence to the mask formed by the second mask step;

a step of removing the mask formed by the second mask step;

an insulating film formation step of forming an insulating film covering the memory cell region and the CMOS logic region;

a step of forming a mask layer to cover the remaining regions of the memory cell region, excluding the CMOS logic region and the selected region of the memory cell region;

a step of selectively etching the insulating film in correspondence to the mask layer, and forming sidewalls in the side faces of the gate electrode used by the CMOS transistor;

a third impurity injection step of forming a diffusion layer of the CMOS transistor in the CMOS logic region, and a second diffusion layer of the memory cell transistor in the selected region of the memory cell region, with the sidewalls as a mask;

a step of depositing a metal on the entire surface after removing the mask layer; and a step of reacting the deposited metal with the exposed diffusion layer of the CMOS transistor and with the exposed second diffusion layer of the memory cell transistor to form a metal silicide.

Thus, by covering the memory cell region with an insulating film and exposing only the diffusion layer region of the CMOS logic region, in accordance with the present invention, the deposited metal reacts with only that diffusion region, and does not impart influence to the memory cell transistor, so the reduction of the CMOS transistor source and drain resistance can be realized by adding only this insulating film masking step.

In addition, by making a metal silicide in either the source or the drain, according to the second aspect of the present invention, an increase in the operating speed of the memory cell transistor can be realized by adding only the above insulating film masking step.

Furthermore, by making a metal silicide in a portion of the drain, according to the third aspect of the present invention, an increase in the operating speed of the memory cell transistor can be realized by adding only the above insulating film masking step.

BRIEF DESCRIPTION OF THE DRAWINGS

In the accompanying drawings:

FIG. 4(a) is a cross sectional view of FIG. 3 taken along the line A–A', and FIG. 4(b) is a cross sectional view of FIG. 3 taken along the line B–B';

FIG. 11(a) is a cross sectional view of FIG. 10 taken along the line A–A', and FIG. 11(b) is a cross sectional view of FIG. 10 taken along the line B–B';

FIG. 32 is a table of the terminal voltage of a memory cell transistor;

DETAILED DESCRIPTION OF THE PREFERRED EMBODIMENTS

Figure 1:
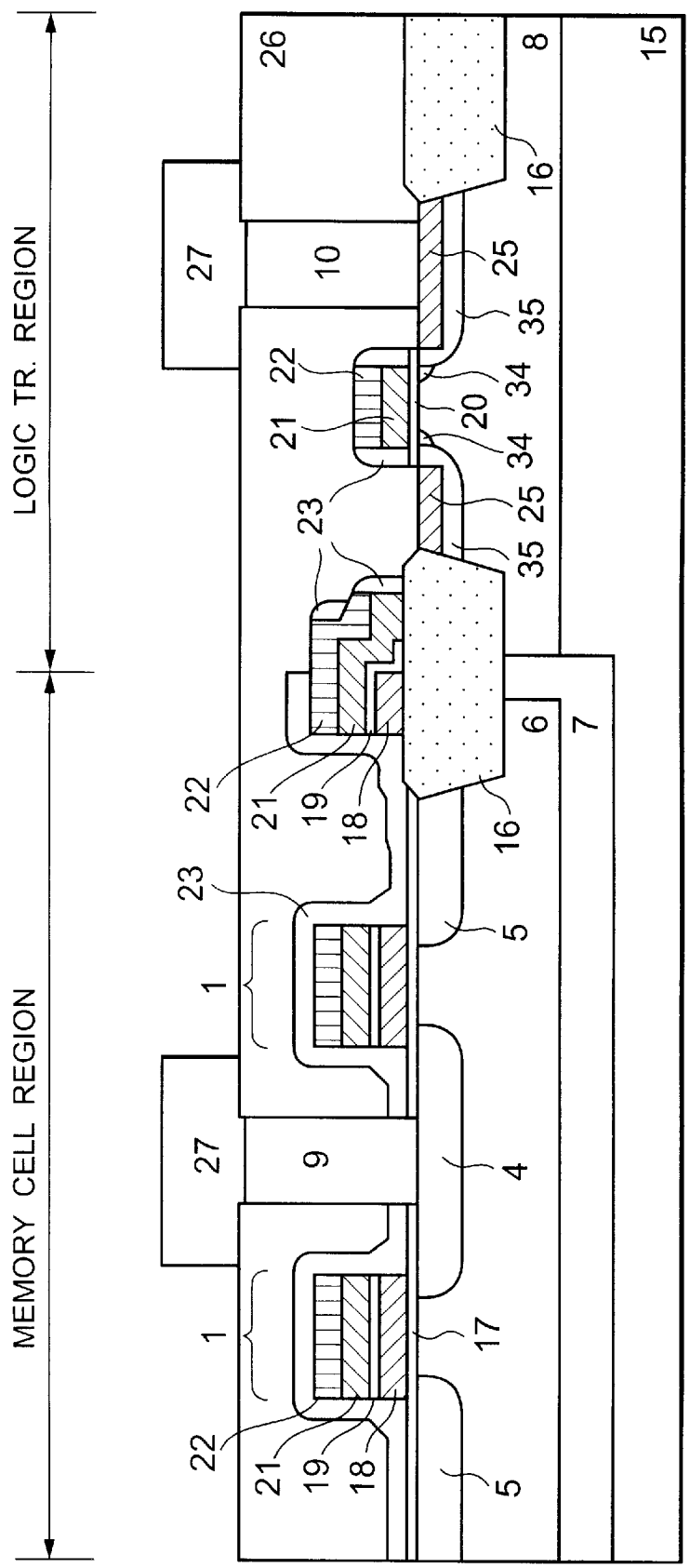
FIG. 1 is a cross sectional view showing a preferred Embodiment of the present invention.

The preferred embodiments of the present invention are explained with reference to FIG. 1.

A memory cell region and a CMOS logic region are prepared within a semiconductor substrate 15. An electrically erasable programmable read-only memory (EEPROM) is formed in the memory cell region, structured by a source diffusion layer 5, a drain diffusion layer 4, a tunnel insulating film 17, a floating gate 2, a poly-poly intermediate insulating film 19, control gates 19 and 22, and an HTO film 23. A CMOS transistor is formed in the CMOS logic region, structured by a source and drain diffusion layer 35, a lightly doped drain 34, a silicide 25, a gate insulating film 20, gate electrodes 36 and 22, and sidewalls 23 formed from an HTO film. The HTO film 23 of the memory cell transistor and a sidewall 23 of the CMOS transistor are formed by the same process.

Embodiment 1 of the present invention is explained using FIGS. 2 to 20.

Figure 2:
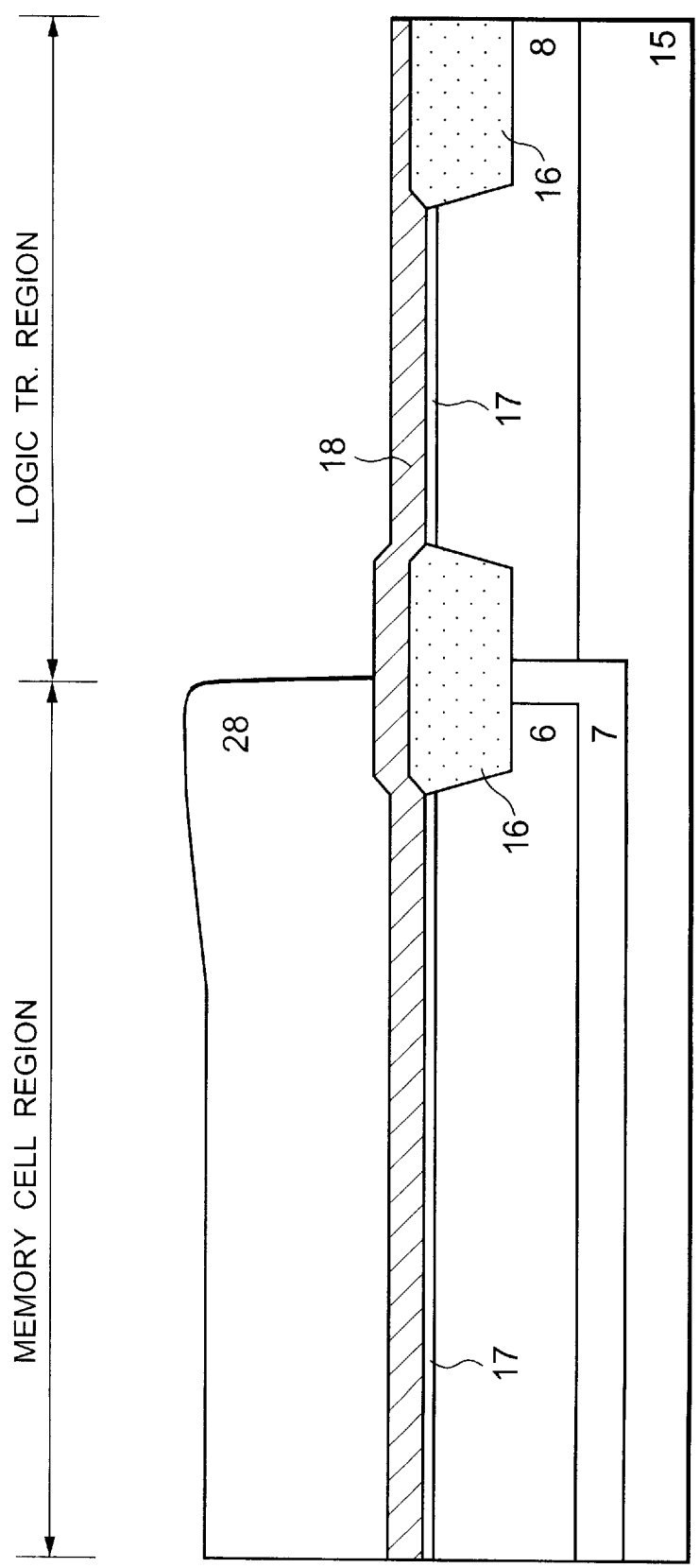
FIG. 2 is a cross sectional view of Embodiment 1 of the present invention.

First, as shown in FIG. 2, an element separation insulating film 16, for separating elements such as transistors, is formed on a P-type semiconductor substrate 15. Impurity diffusion or ion injection is used and a P-well 6 and an N-well 7 of the memory cell region are formed, together with a P-well 8 and an N-well (not shown) of a logic Tr region, in which a MOS transistor for a logic is formed, being formed. Afterward, a tunnel oxide film 17 and a first polysilicon layer 18, used by the memory cell transistor, are grown, and a photoresist 28 for floating gate partition pattern forming is selectively formed on the first polysilicon layer 18.

Figure 3:
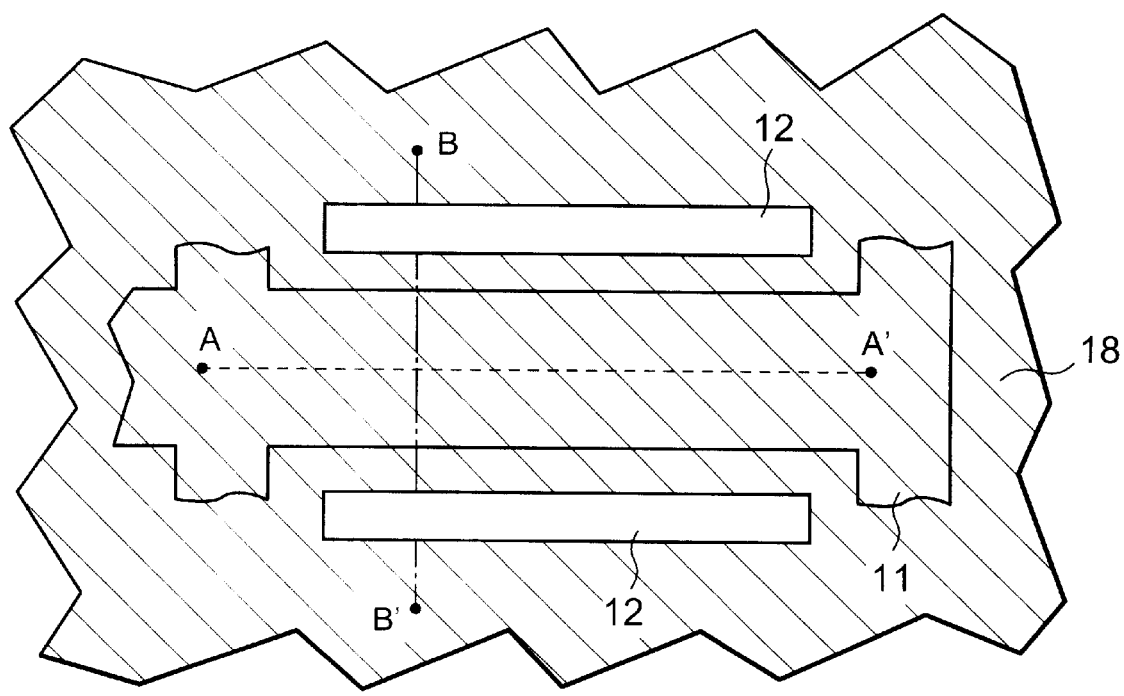
FIG. 3 is a planar diagram of Embodiment 1 of the present invention, in continuation of FIG. 2.

Next, plasma etching is performed with the photoresist 28 as a mask for the first polysilicon layer 18, and the logic Tr region is opened, together with the memory cell floating gate being cut. A planar view of the memory cell region, in a state with the photoresist 28 peeled off after the plasma etching, is shown in FIG. 3, a cross sectional view of FIG. 3 taken along the line A–A' is shown in FIG. 4(a), and a cross sectional view of FIG. 3 taken along the line B–B' is shown in FIG. 4(b).

As shown in FIG. 4(a), the first polysilicon layer 18 covering the logic Tr region is removed as a result of plasma etching with the photoresist 28 as a mask, exposing the tunnel oxidation film 17. Similarly, the floating gate 18 of the memory cell region is partitioned along the B–B' direction by each of floating gate partition patterns 12 as a result of plasma etching with the photoresist 28 as a mask.

Figure 5:
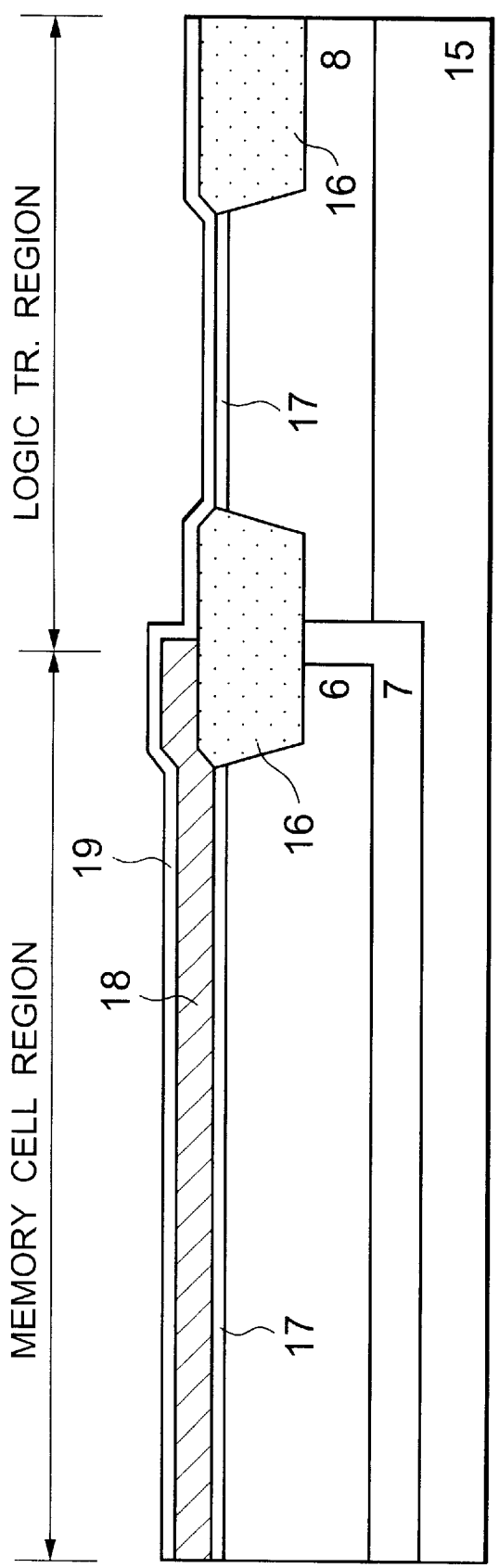
FIG. 5 is a cross sectional view of Embodiment 1 of the present invention, in continuation of FIG. 4(a)

Afterward, as shown in FIG. 5, the poly-poly intermediate insulating film 19 is formed from an ONO film, made up of an oxide film / nitride film / oxide film, to cover the tunnel oxide film 17 on the memory cell region and the floating gate 18 of the memory cell region. The poly-poly intermediate insulating film 19 is formed in order to prevent a carrier leak from the floating gate 18.

Figure 6:
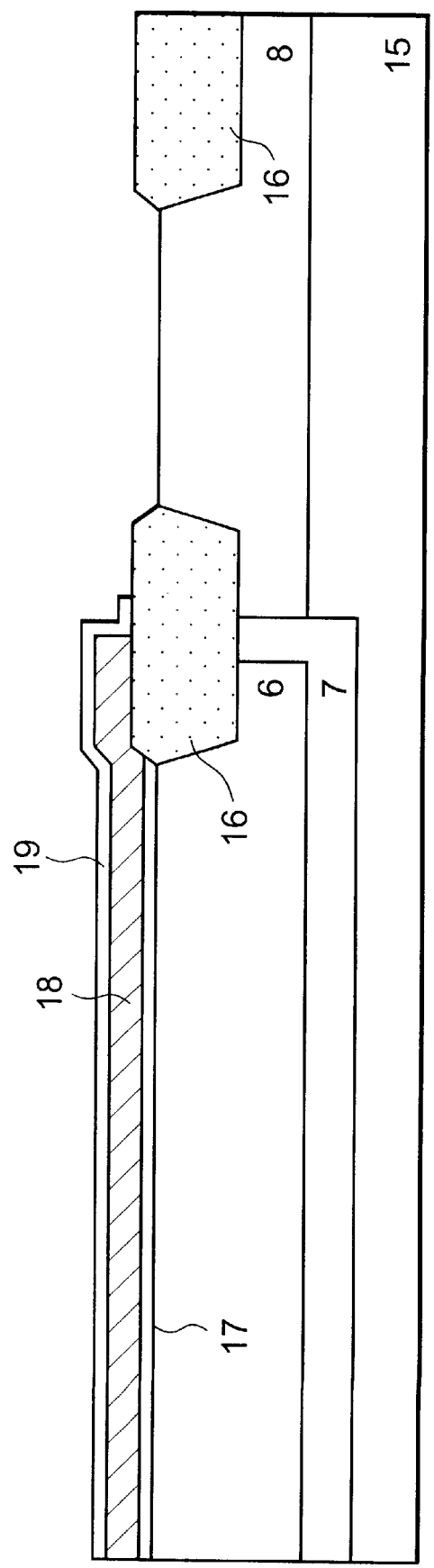
FIG. 6 is a cross sectional view of Embodiment 1 of the present invention, in continuation of FIG. 5.

The poly-poly intermediate insulating film 19 and the tunnel oxide film 17 are not required in the logic Tr region, so the poly-poly intermediate insulating film 19 and the tunnel oxide film 17 on the logic Tr region are selectively removed, as shown in FIG. 6, exposing the surface of the P-well 8, which is the element forming region (the surface of the N-well is similarly exposed in other portions on the logic Tr region not shown in the figures).

Figure 7:
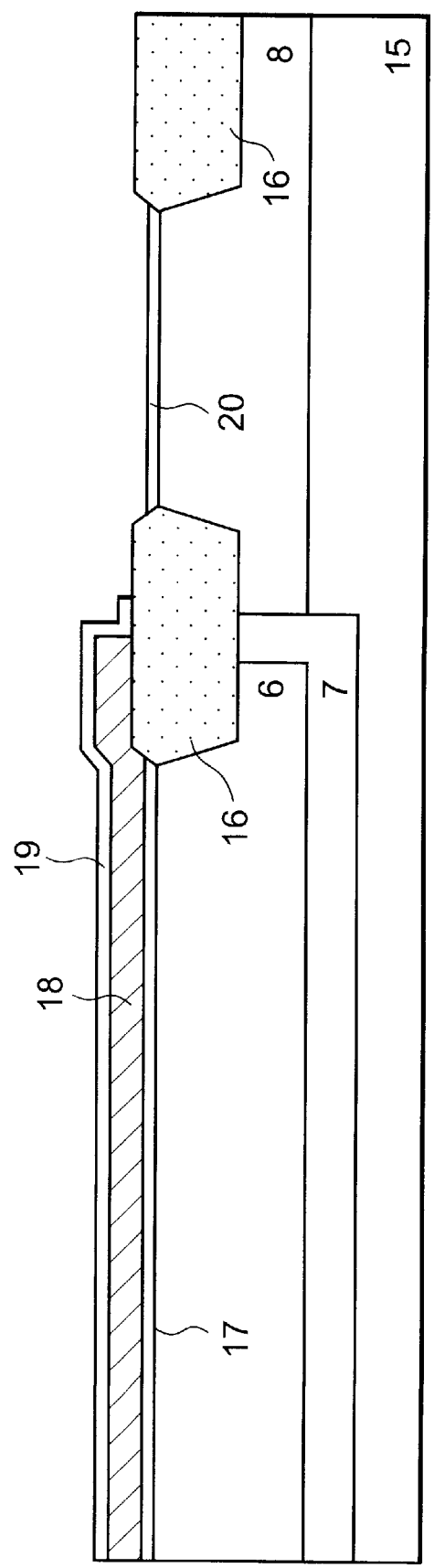
FIG. 7 is a cross sectional view of Embodiment 1 of the present invention, in continuation of FIG. 6.

Next, in order to form a gate insulating film for the transistor formed in the logic Tr region, a gate oxide film 20, made up of a thermal oxide film formed by thermal oxidation on the surface of the exposed P-well, is formed as shown in FIG. 7.

Figure 8:
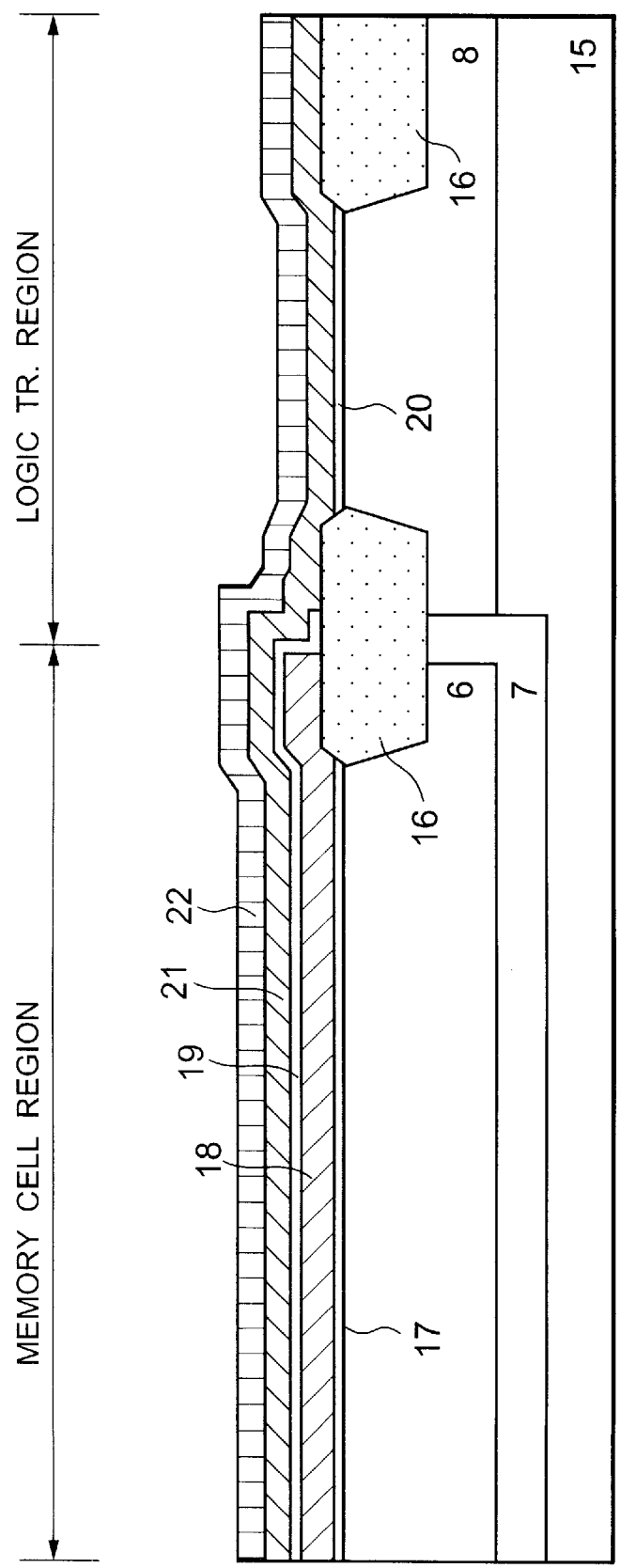
FIG. 8 is a cross sectional view of Embodiment 1 of the present invention, in continuation of FIG. 7.

Afterward, as shown in FIG. 8, a second polysilicon layer 21 is formed so as to cover the gate oxide film 20 on the logic Tr region and the poly-poly intermediate insulating film 19 on the memory cell region. In addition, a tungsten silicide (WSi) layer 22 is grown by sputtering on the second polysilicon layer 21. The WSi layer 22 is formed in order to reduce the resistance of the second polysilicon layer 21.

The base in order to form the memory cell transistor and the MOS transistor is thus completed in accordance with the processes shown in FIGS. 2 to 8.

Next, the memory cell transistor is formed first.

Figure 9:
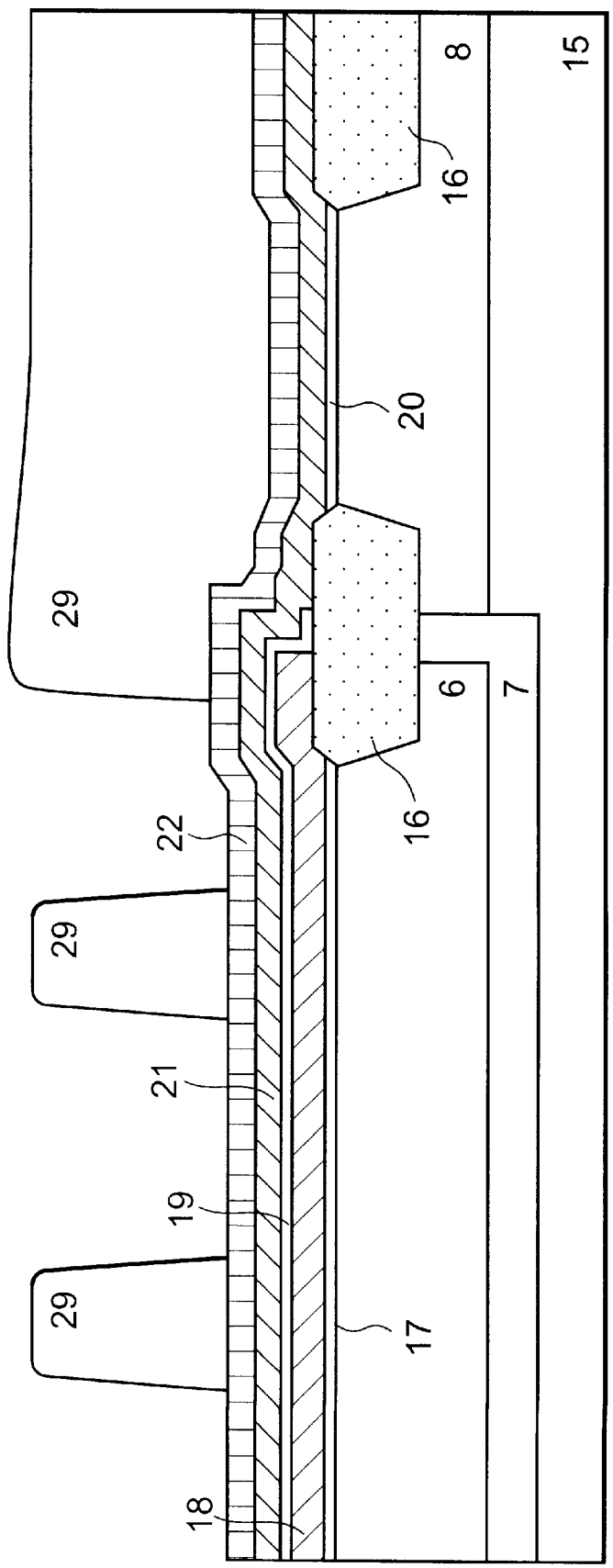
FIG. 9 is a cross sectional view of Embodiment 1 of the present invention, in continuation of FIG. 8.

As shown in FIG. 9, a photoresist 29 is selectively formed on the WSi layer 22, and it masks a region in which a gate electrode of the memory cell transistor of the memory cell region must be formed, together with masking the entire surface of the logic Tr region. Next plasma etching is used and the region of a 2-layer gate opened by the photoresist 29, and structured by the first polysilicon layer 2, the poly-poly intermediate insulating film 19, the second polysilicon layer 21, and the WSi layer 22, is removed, and the gate electrode of the memory cell transistor is formed.

Figure 10:
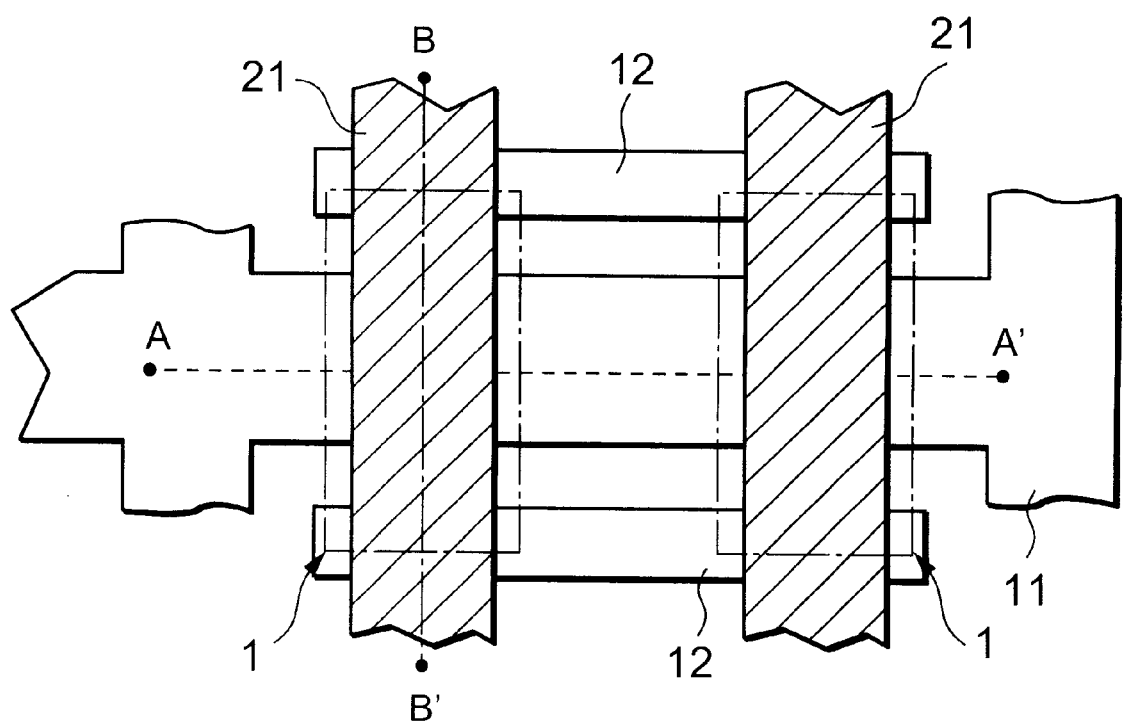
FIG. 10 is a planar view of Embodiment 1 of the present invention, in continuation of FIG. 9.

A planar view of the memory cell region, in a state with the photoresist 29 peeled off after the plasma etching, is shown in FIG. 10, a cross sectional view of FIG. 10 taken along the line A–A' is shown in FIG. 11(a), and a cross sectional view of FIG. 10 taken along the line B–B' is shown in FIG. 11(b).

The control gate made up of the second polysilicon layer 21 and the WSi layer 22 is formed extending in the B–B' direction, while the control gate and the first polysilicon layer 18 are partitioned in the A–A' direction, and the first polysilicon layer 18 becomes the floating gate 18, not electrically connected anywhere, as shown in FIG. 11(b). In addition, a source 5 and a drain 4 of the memory cell transistor are formed in a self aligning manner, as shown in FIG. 11(a), by ion injection with the control gate and the floating gate 18 as a mask. The control gate extending in the B–B' direction is used as a word line of the memory cell transistor.

After forming the memory cell as stated above, there is a switch to the processes of forming a MOS transistor in the logic Tr region.

Figure 12:
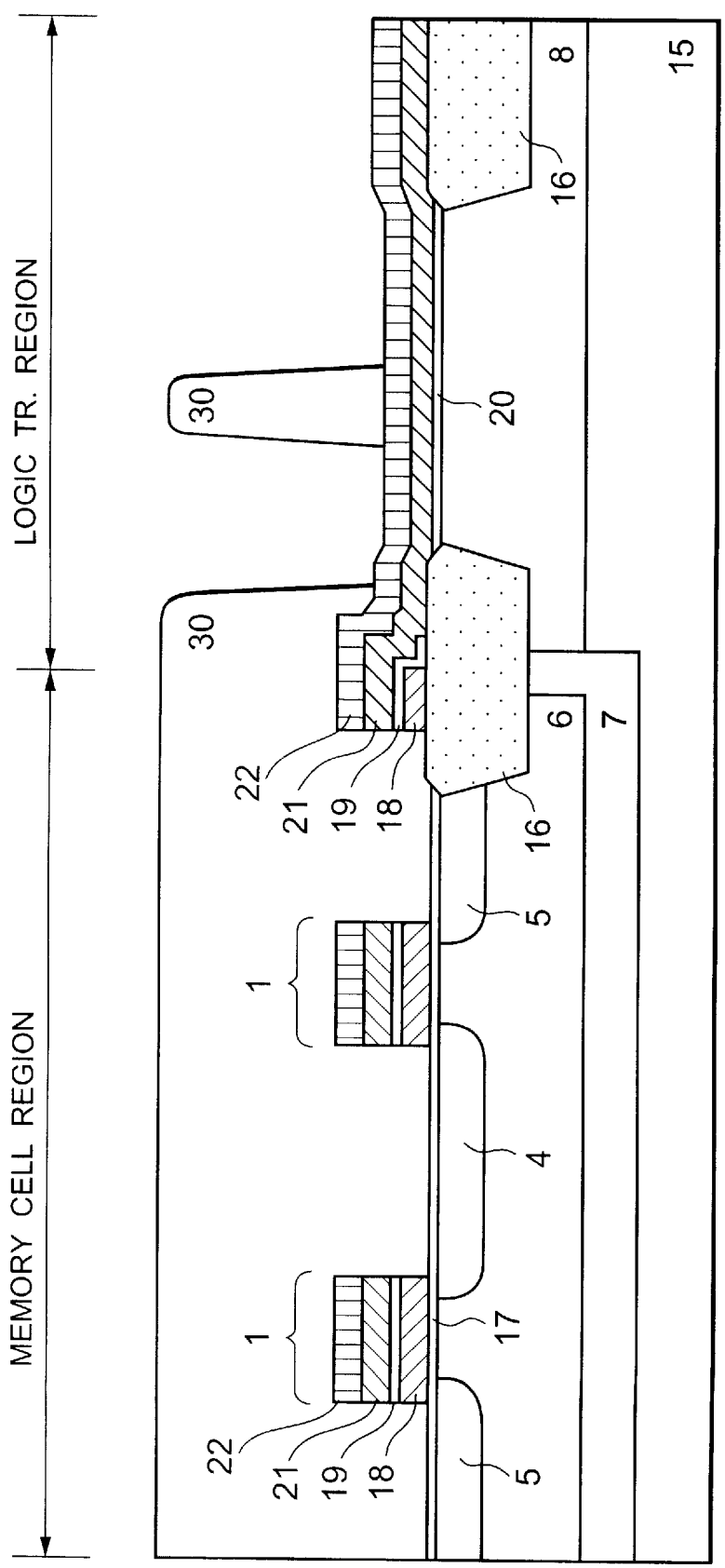
FIG. 12 is a cross sectional view of Embodiment 1 of the present invention, in continuation of FIG. 11(a)
Figure 13:
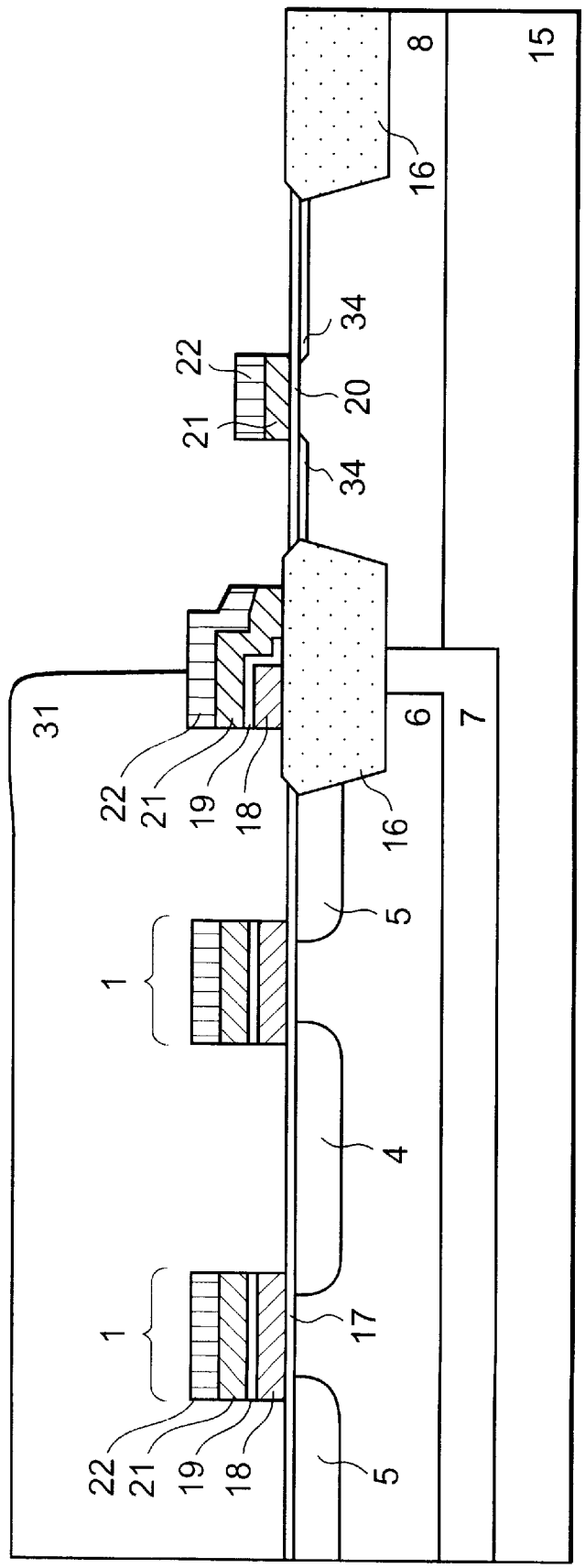
FIG. 13 is a cross sectional view of Embodiment 1 of the present invention, in continuation of FIG. 12.

As shown in FIG. 12, a photo resist 30 is formed to cover the memory cell region in which the memory cell transistor is formed, while at the same time is selectively formed on the region for forming a gate electrode on the logic Tr region. Afterward, the exposed WSi 22 and the second polysilicon layer 21 are etched by plasma etching, and the remaining portions of the WSi 22 and the second polysilicon layer 21 become the gate electrode of the MOS transistor, as shown in FIG. 13. In order to form a MOS transistor with a lightly doped drain (LDD) structure, LDD ion injection is performed with a photoresist 31 and the gate electrode covering the memory cell region as a mask, forming a lightly doped diffusion layer 34.

Figure 14:
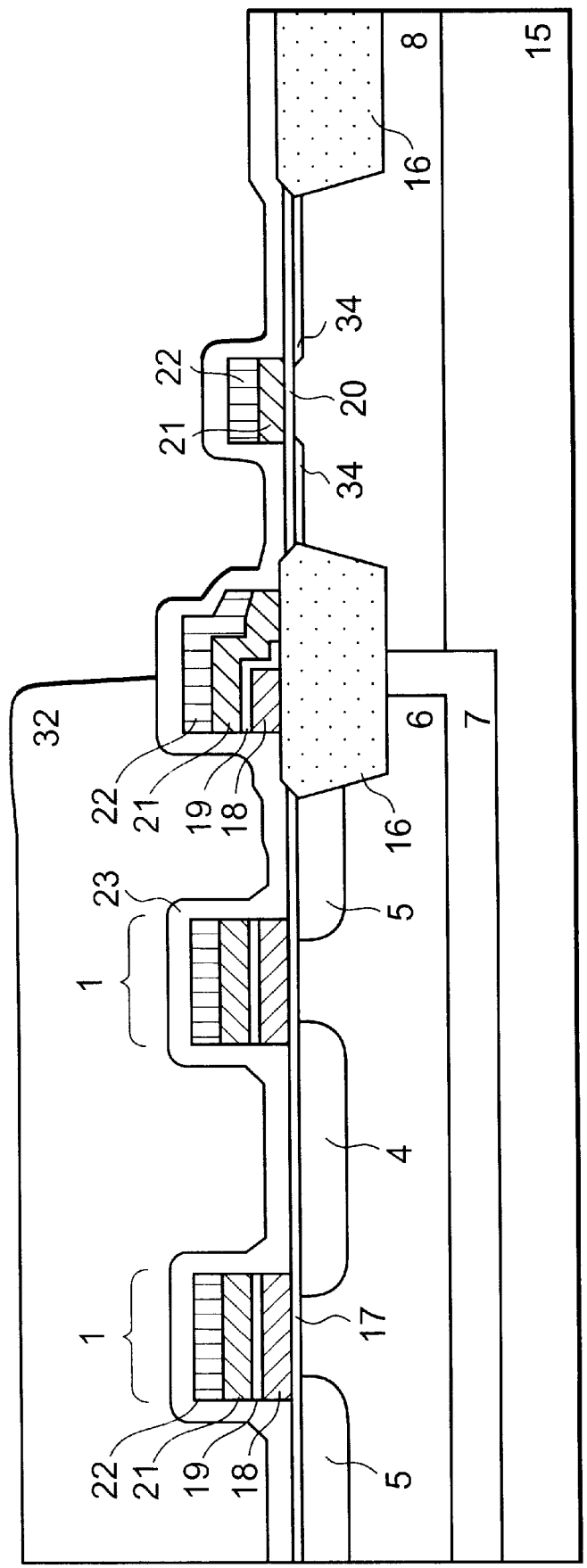
FIG. 14 is a cross sectional view of Embodiment 1 of the present invention, in continuation of FIG. 13.
Figure 15:
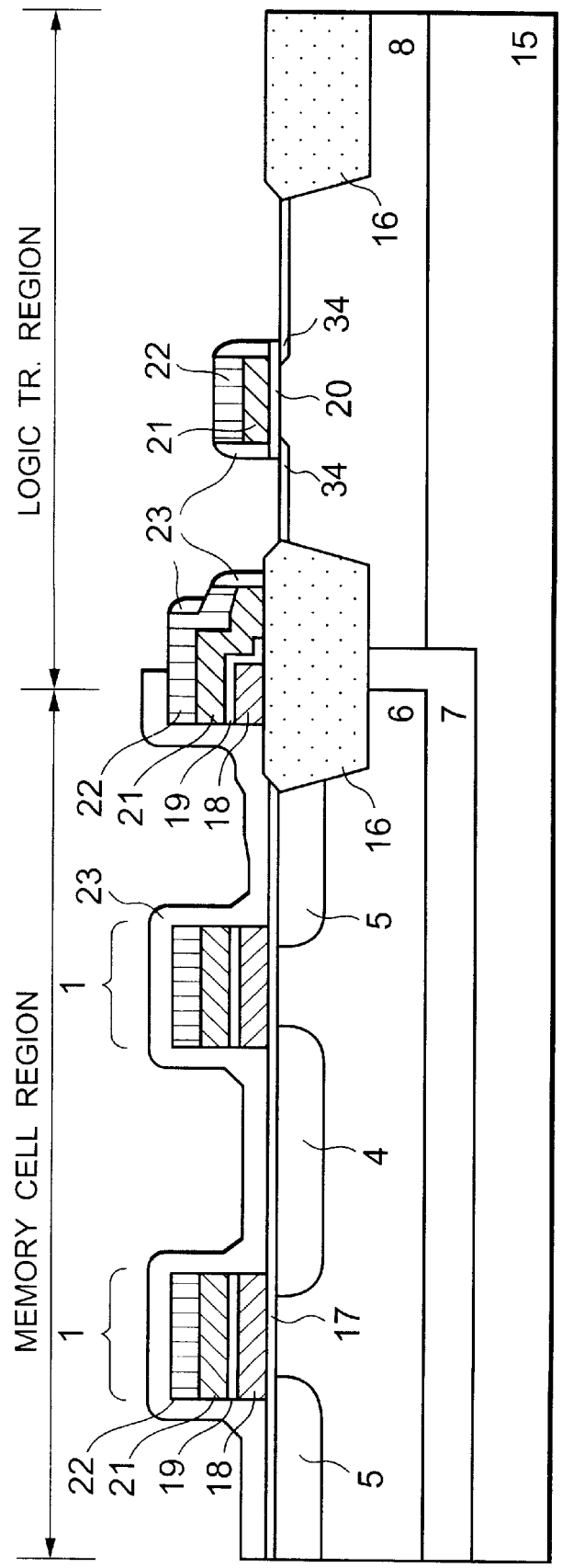
FIG. 15 is a cross sectional view of Embodiment 1 of the present invention, in continuation of FIG. 14.

Next, the photoresist 31 is peeled off, an approximately 1000 angstrom LDD hot thermal oxide (HTO) film 23 is deposited over the entire surface, and a photoresist 32 is selectively formed so as to cover the memory cell region, as shown in FIG. 14. By carrying out the etch back the LDD HTO film 23 with the photoresist 32 as a mask, LDD sidewalls are formed in the side faces of the MOS transistor gate electrode, while the thick, approximately 1000 angstrom LDD HTO film 23 is left as a protection film for a silicide formation process in the memory cell region. Afterward, the photoresist 32 is peeled off, becoming the state shown in FIG. 15.

Figure 16:
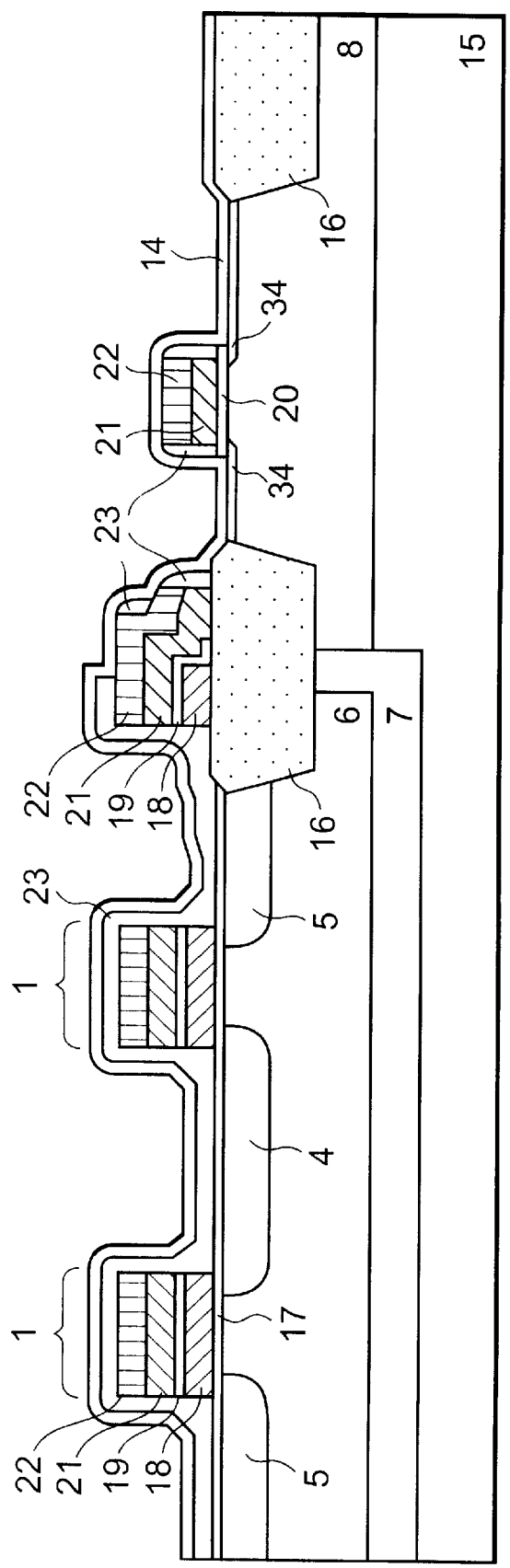
FIG. 16 is a cross sectional view of Embodiment 1 of the present invention, in continuation of FIG. 15.
Figure 17:
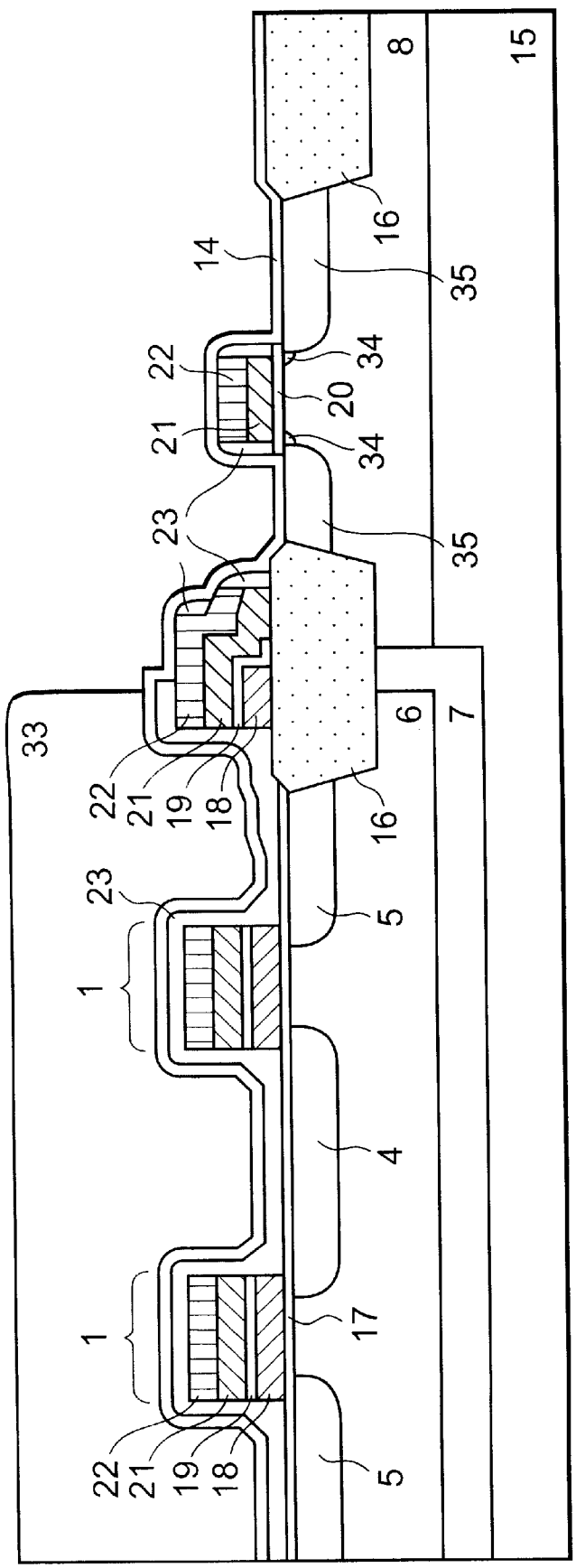
FIG. 17 is a cross sectional view of Embodiment 1 of the present invention, in continuation of FIG. 16.

After peeling off the photoresist 32, a through film 14 is formed over the entire surface from an oxide film formed by CVD, as shown in FIG. 16, in order to prevent undesirable destruction of the crystal structure by ion injection.

Afterward, a photoresist 33 is formed so as to cover the memory cell region, and ion injection is performed with the photoresist 33, the MOS transistor gate electrode, and the LDD sidewall as masks, forming a diffusion layer 35 which becomes a source and drain of the MOS transistor.

Figure 18:
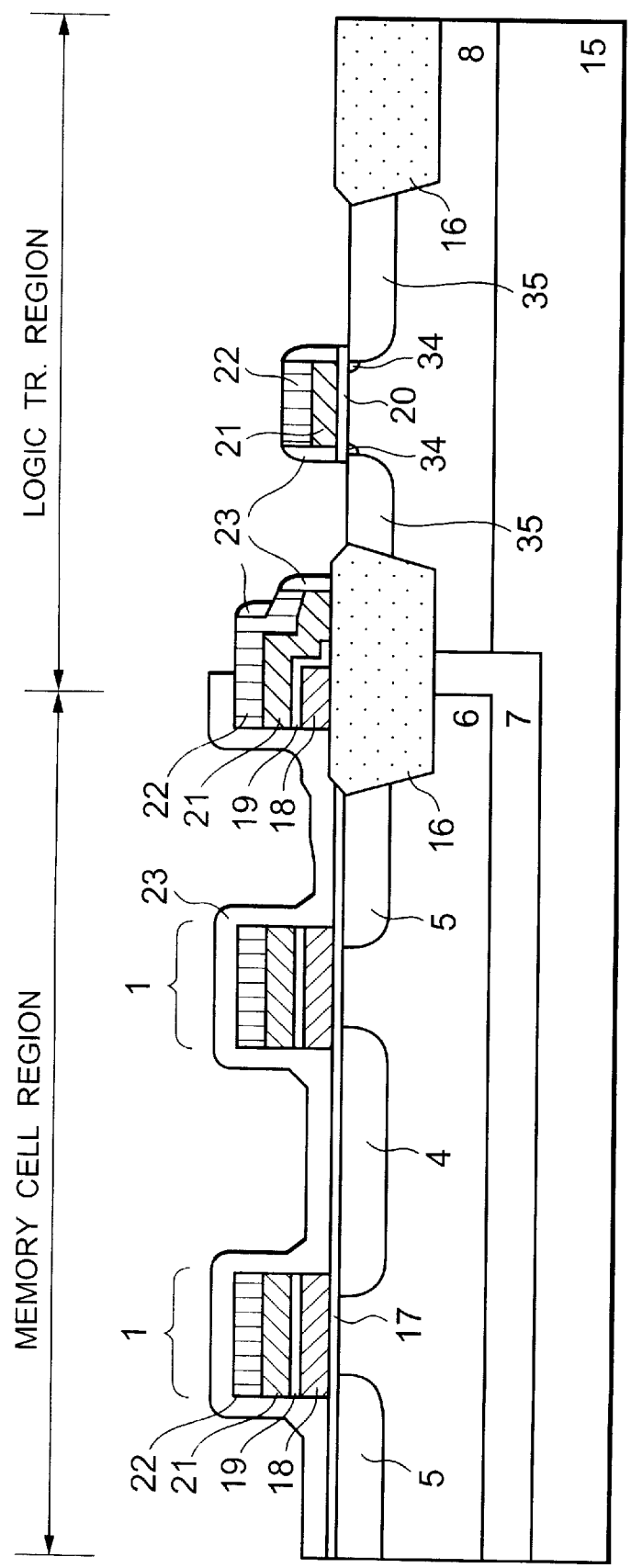
FIG. 18 is a cross sectional view of Embodiment 1 of the present invention, in continuation of FIG. 17.

The photoresist 33 is removed next, and the diffusion layer 35 is made amorphous in order to form a silicide on the MOS transistor diffusion layer 35. At this point, for example, arsenic injection is performed over the entire wafer, but the memory cell region is covered by the LDD HTO film 23, so arsenic injection does not occur there. Arsenic injection does occur in the exposed diffusion layer 35, and the surface of the diffusion layer 35 is made amorphous. After the amorphous making process is complete, the oxidized film 14 on the logic Tr region diffusion layer 35 is removed as shown in FIG. 18, exposing the diffusion layer 35.

Figure 19:
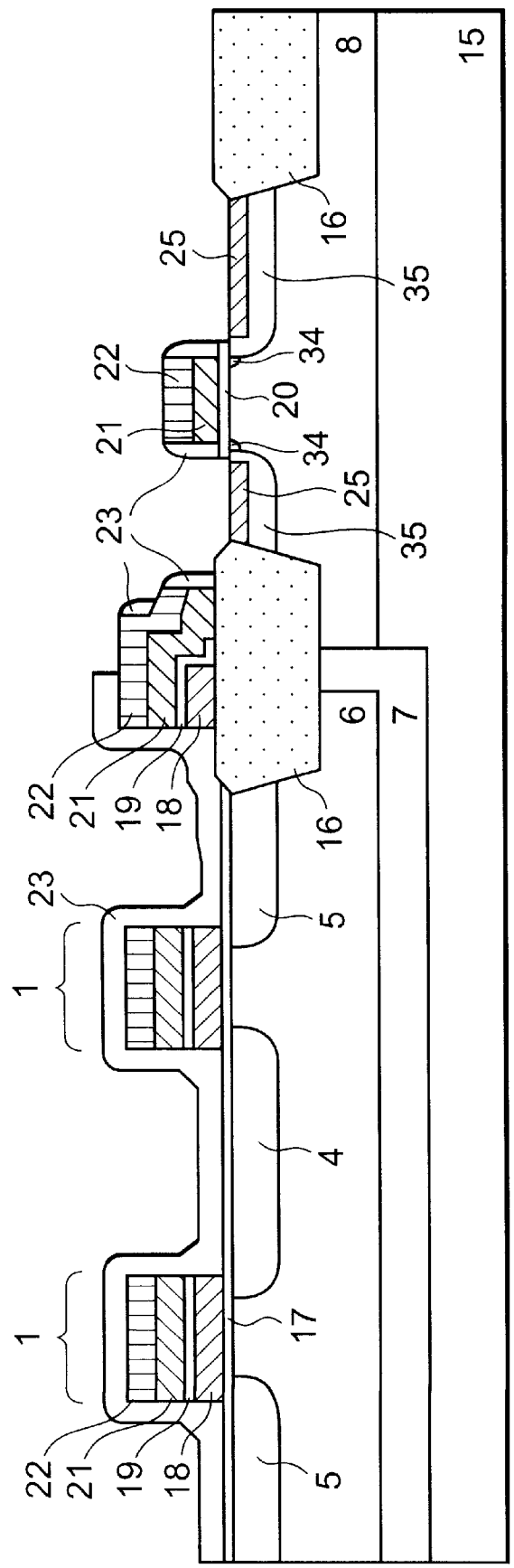
FIG. 19 is a cross sectional view of Embodiment 1 of the present invention, in continuation of FIG. 18.
Figure 20:
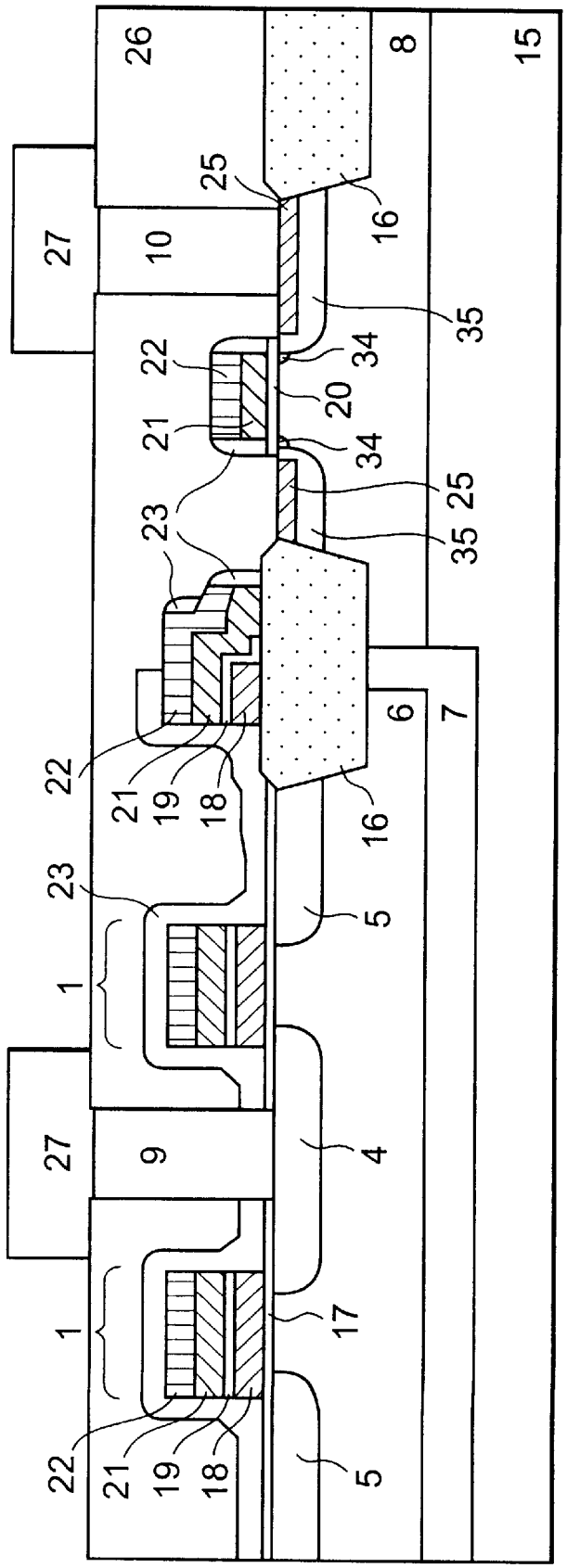
FIG. 20 is a cross sectional view of Embodiment 1 of the present invention, in continuation of FIG. 19.

By exposing the diffusion layer 35 and performing titanium sputtering, titanium is formed even on the amorphous diffusion layer 35. By performing heat treatment of the titanium formed on the diffusion layer 35, the amorphous diffusion layer 35 and the titanium react, forming a titanium silicide (TiSi) 25. The memory cell region is covered by the LDD HTO film 23 for titanium sputtering, so titanium and silicon do not react, and TiSi is not formed. Afterward, the TiSi only can be made to remain by removing the un-reacted titanium by wet etching, etc., as shown in FIG. 19.

After thus forming the memory cell transistor and the MOS transistor, an interlayer insulating film 20 is formed on the entire surface, a contact hole 9 used by the memory cell transistor and a contact hole 10 used by the MOS transistor are selectively opened, and by connecting to upper layer wiring 27 made of Al, etc., it is possible to optionally connect to the memory cell transistor and the MOD transistor.

The case of protecting the diffusion layer of the entire memory cell region from the silicide forming process is explained in Embodiment 1 above, but a high concentration diffusion layer in which silicide aggregation becomes a problem is necessary only for the diffusion layer to which a high voltage is applied during programming, and it is not necessary to protect the entire diffusion layer of the memory cell transistor. In particular, by reducing the line resistance of long wirings such as the memory cell transistor source line, the read-out speed can be increased. Therefore, when a high voltage is not applied to the memory cell source, for example, in the case of the applied voltage shown in FIG. 32, the source line resistance can be reduced by forming a silicide layer in the source diffusion layer.

Embodiment 2 of the present invention, in which the source line resistance is reduced, is explained below while referring to FIGS. 21 to 26.

The process of forming the double gate memory cell transistor of the memory cell region, namely the process from FIG. 2 to FIG. 9, are identical to those of Embodiment 1, so that explanation is omitted.

Figure 21:
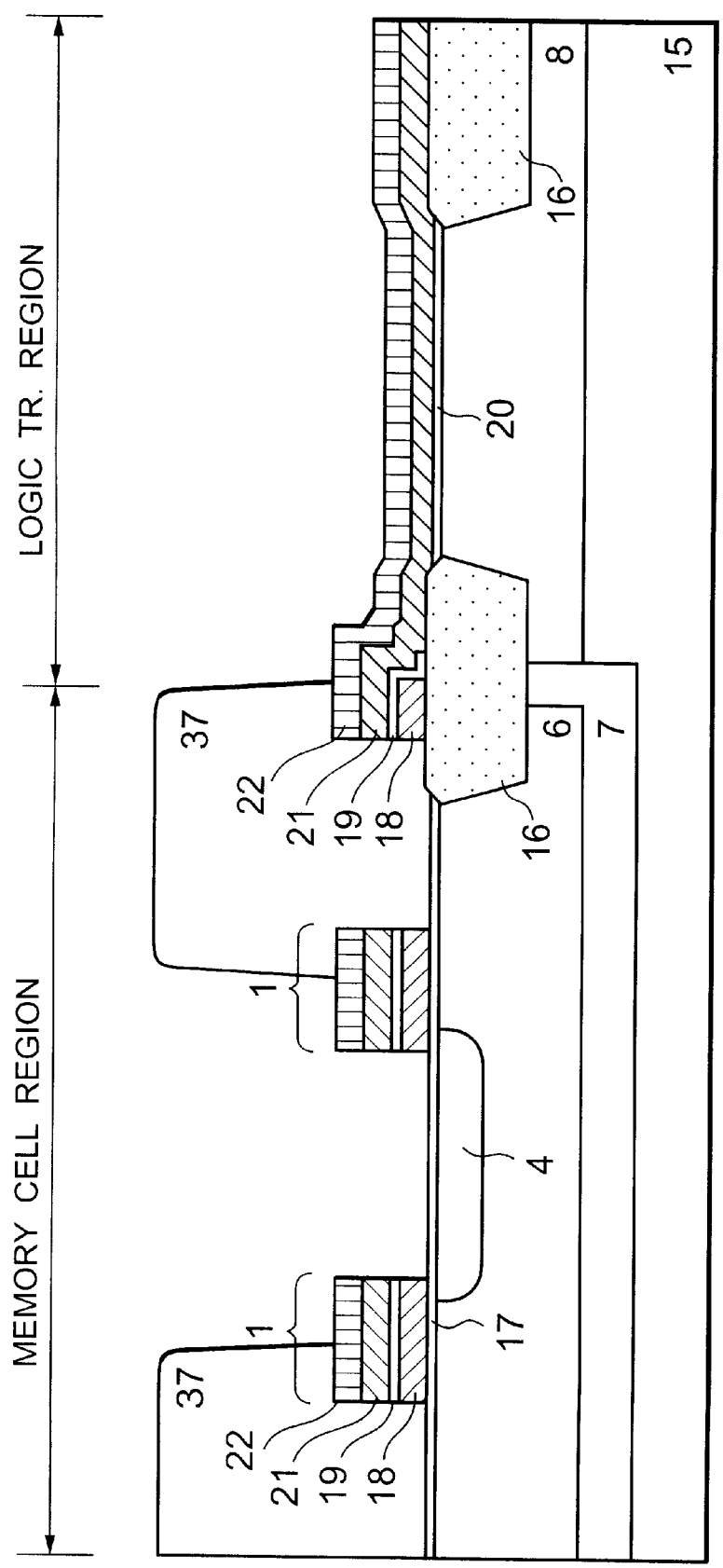
FIG. 21 is a cross sectional view of Embodiment 2 of the present invention.

The double gate is formed in accordance with FIG. 9, and after removing the photoresist 29, a photoresist 37 is formed in order to mask the exposed portion of the P-well 6 which becomes the memory cell transistor source, and ion injection is performed in the exposed portion of the P-well 6 which becomes the drain, forming the high concentration diffusion layer 4, as shown in FIG. 21.

Next, the second polysilicon layer 21 and the WSi 22 are selectively etched using a mask, not shown in the figures, in order to form a MOS transistor gate electrode in the logic Tr region.

Figure 22:
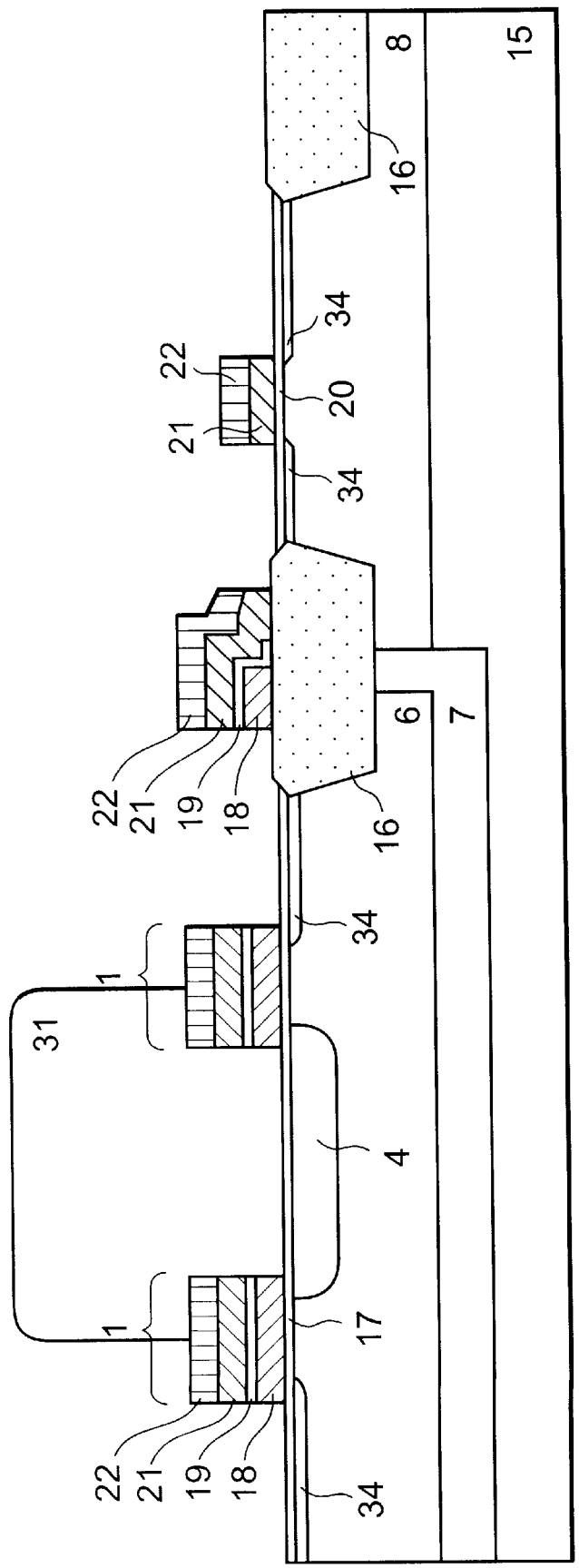
FIG. 22 is a cross sectional view of Embodiment 2 of the present invention, in continuation of FIG. 21.

Afterward, ion injection is performed in order to make the logic Tr region MOS transistor into an LDD structure, but before that the drain diffusion region 4 of the memory transistor is covered with the photoresist 31 to prevent deterioration of its characteristics. LDD ion injection is performed in the region which becomes the source of the memory cell transistor, and in the region which becomes the source and drain of the MOS transistor, forming the lightly doped diffusion layers 34, as shown in FIG. 22.

Figure 23:
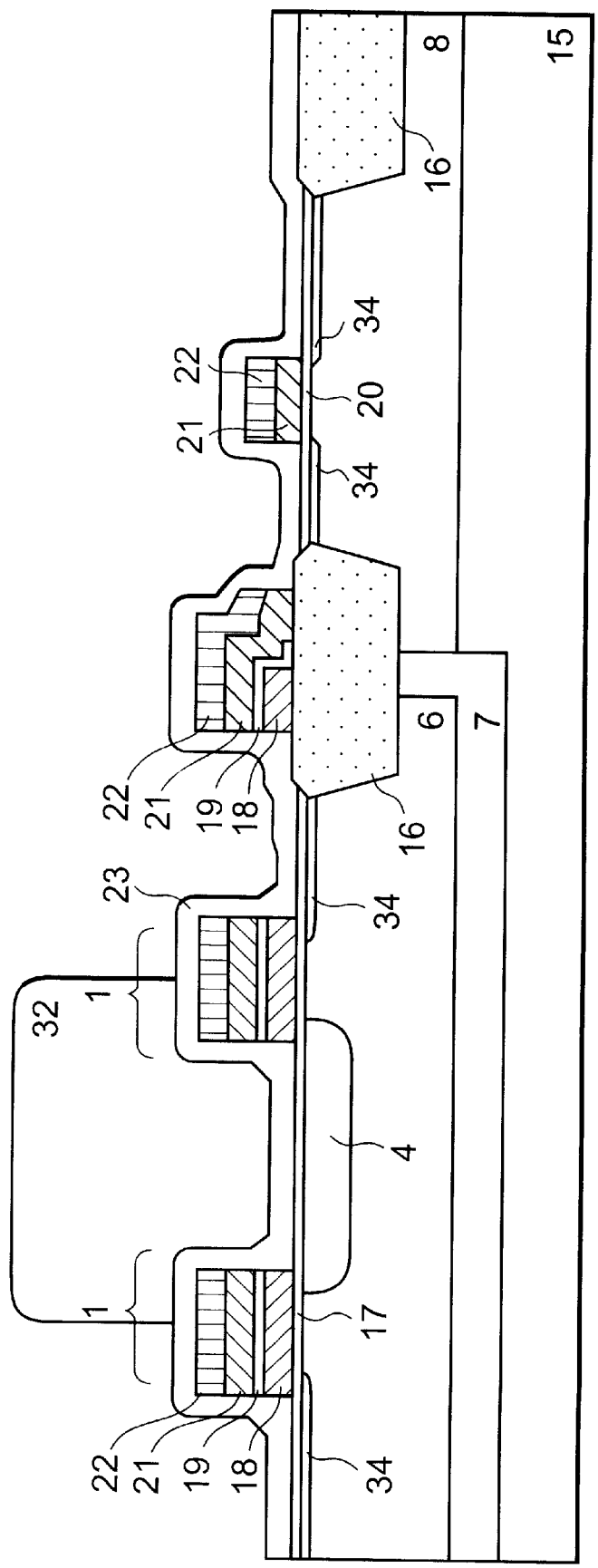
FIG. 23 is a cross sectional view of Embodiment 2 of the present invention, in continuation of FIG. 22.
Figure 24:
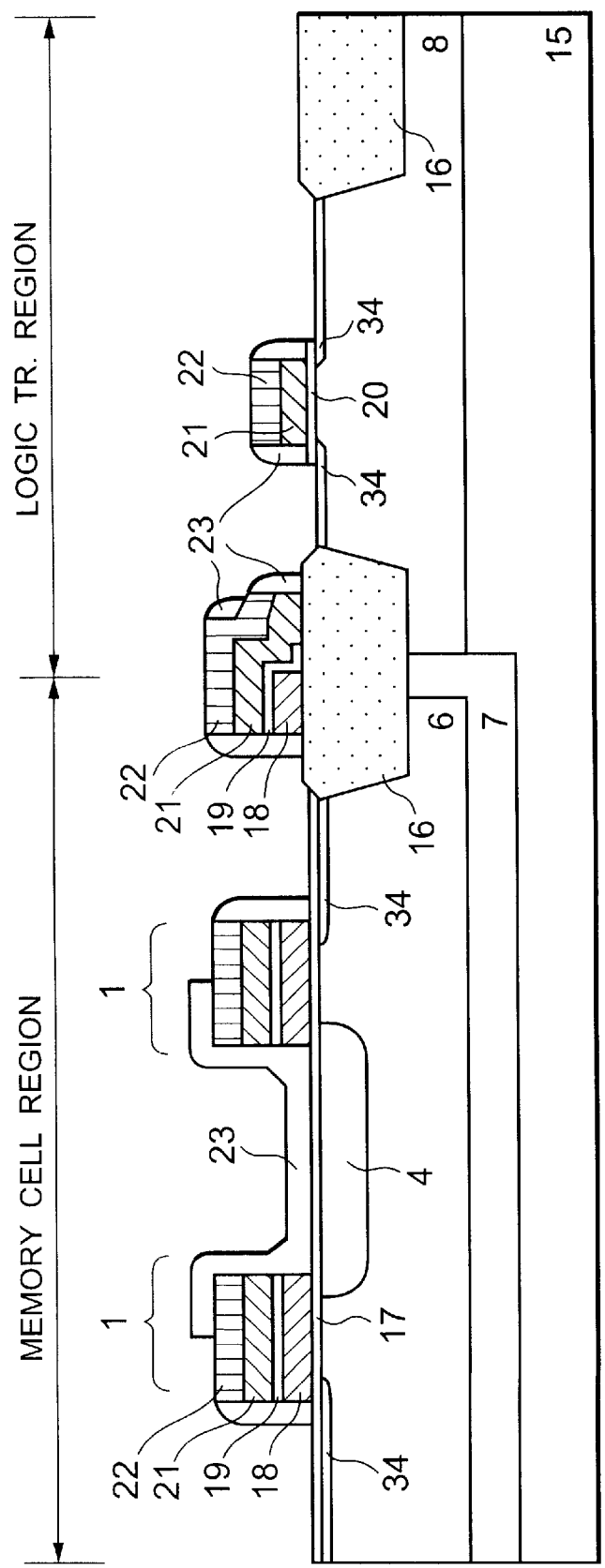
FIG. 24 is a cross sectional view of Embodiment 2 of the present invention, in continuation of FIG. 23.

After peeling off the resist 31, the LDD HTO film 23 is formed over the entire surface to 1000 angstroms, as shown in FIG. 23, and the photoresist 32 is selectively formed on the drain diffusion region 4 of the memory cell transistor. The LDD HTO film 23 is selectively etched, with the photoresist 32 as a mask. After peeling off the photoresist 32, as shown in FIG. 24, sidewalls are formed in the side faces of the MOS transistor gate in the logic Tr region, while sidewalls are also formed in the side walls of the source side gate electrode of the memory cell region memory cell transistor, which is not covered with the photoresit 32.

Figure 25:
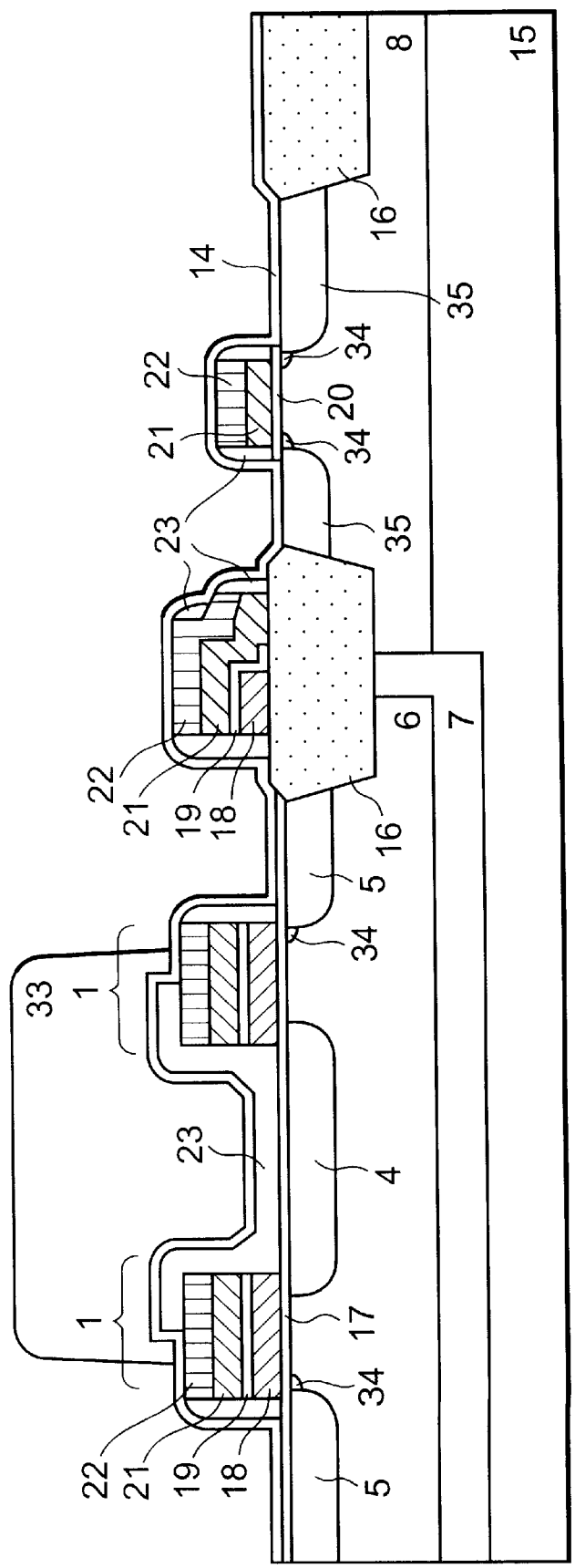
FIG. 25 is a cross sectional view of Embodiment 2 of the present invention, in continuation of FIG. 24.

Next, as shown in FIG. 25, the through film 14 is formed over the entire surface for ion injection, while the photoresist 33 is formed so as to be left on the through film 14 only above the drain diffusion region 4 of the memory cell transistor. Ion injection is performed with the photoresist 33 as a mask, and the source diffusion region 5 of the memory cell transistor, and the diffusion region 35, which becomes the source and drain of the MOS transistor, are formed.

Next, the photoresist 33 is removed, and a process of making the diffusion layer 35 and the source diffusion region 5 amorphous is performed in order to form a silicide on the diffusion layer 35 of the MOS transistor and on the source diffusion region 5 of the memory cell transistor. At this point, arsenic injection, for example, is performed over the entire wafer, but the drain region 4 of the memory cell region is covered by the LDD HTO film 23, so arsenic injection does not occur there. Arsenic injection occurs in the exposed diffusion layer 35 and the source diffusion region 5, and the surfaces of the diffusion layer 35 and the source diffusion region 5 become amorphous. After the amorphous process is complete, the through film 14 on the diffusion layer 35 and on the source diffusion region 5 is removed, exposing the diffusion layer 35 and the source diffusion region 5.

Figure 26:
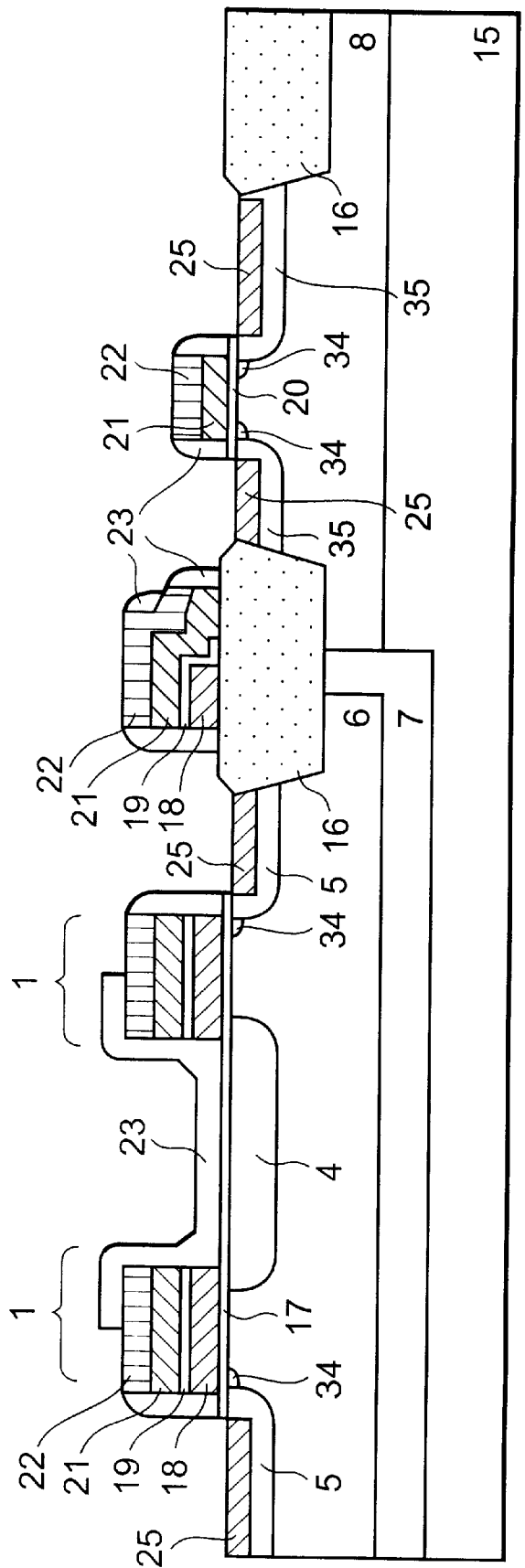
FIG. 26 is a cross sectional view of Embodiment 2 of the present invention, in continuation of FIG. 25.
Figure 27:
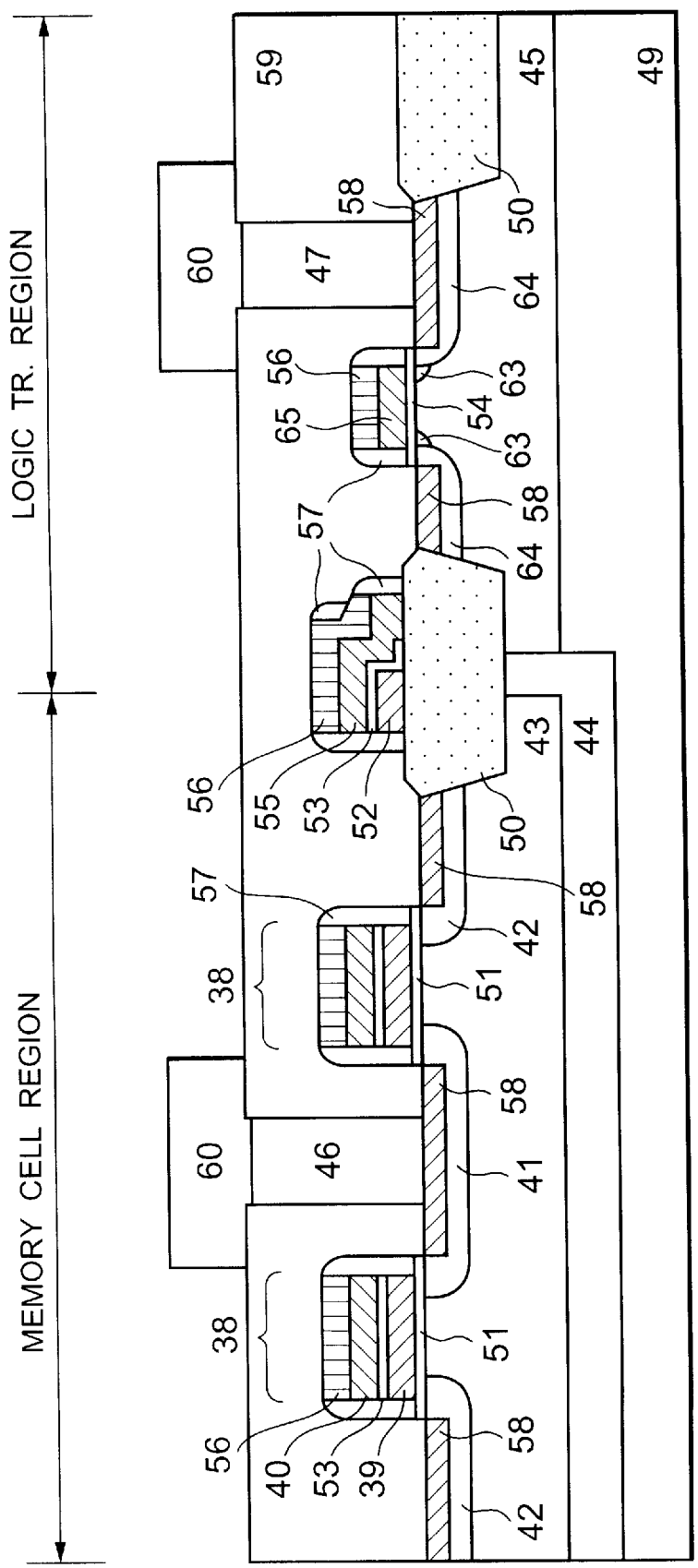
FIG. 27 is a cross sectional view of a first conventional technique.
Figure 28:
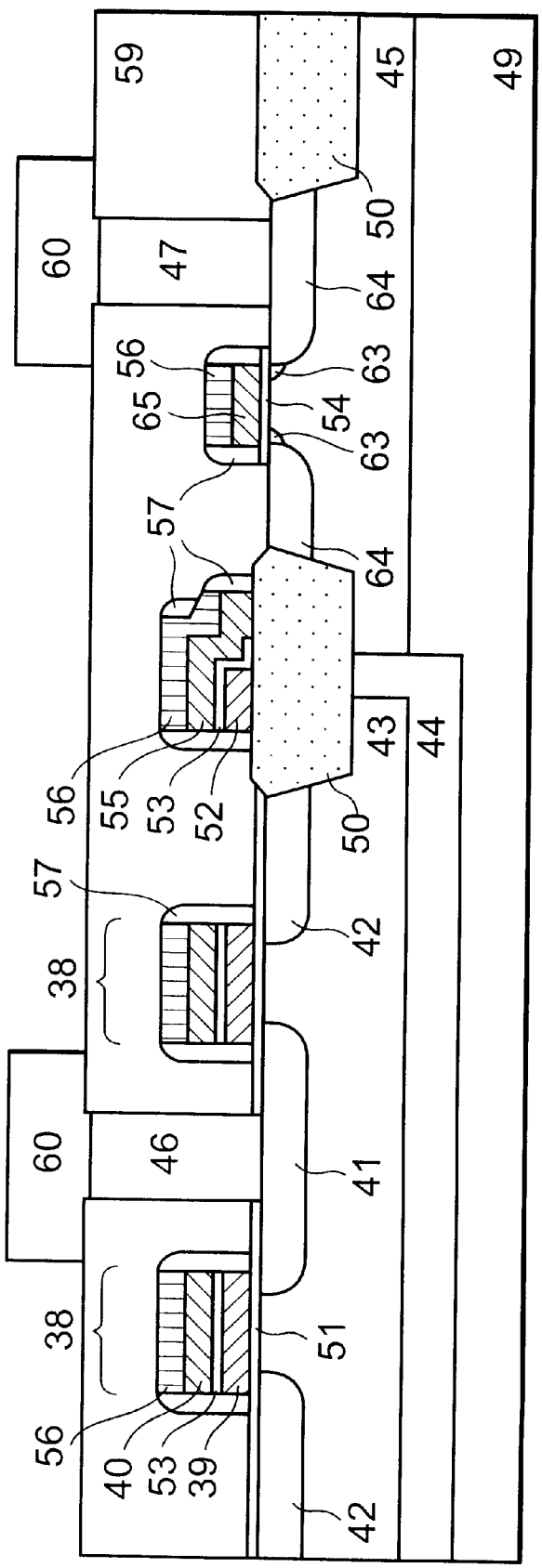
FIG. 28 is a cross sectional view of a second conventional technique.
Figure 29:
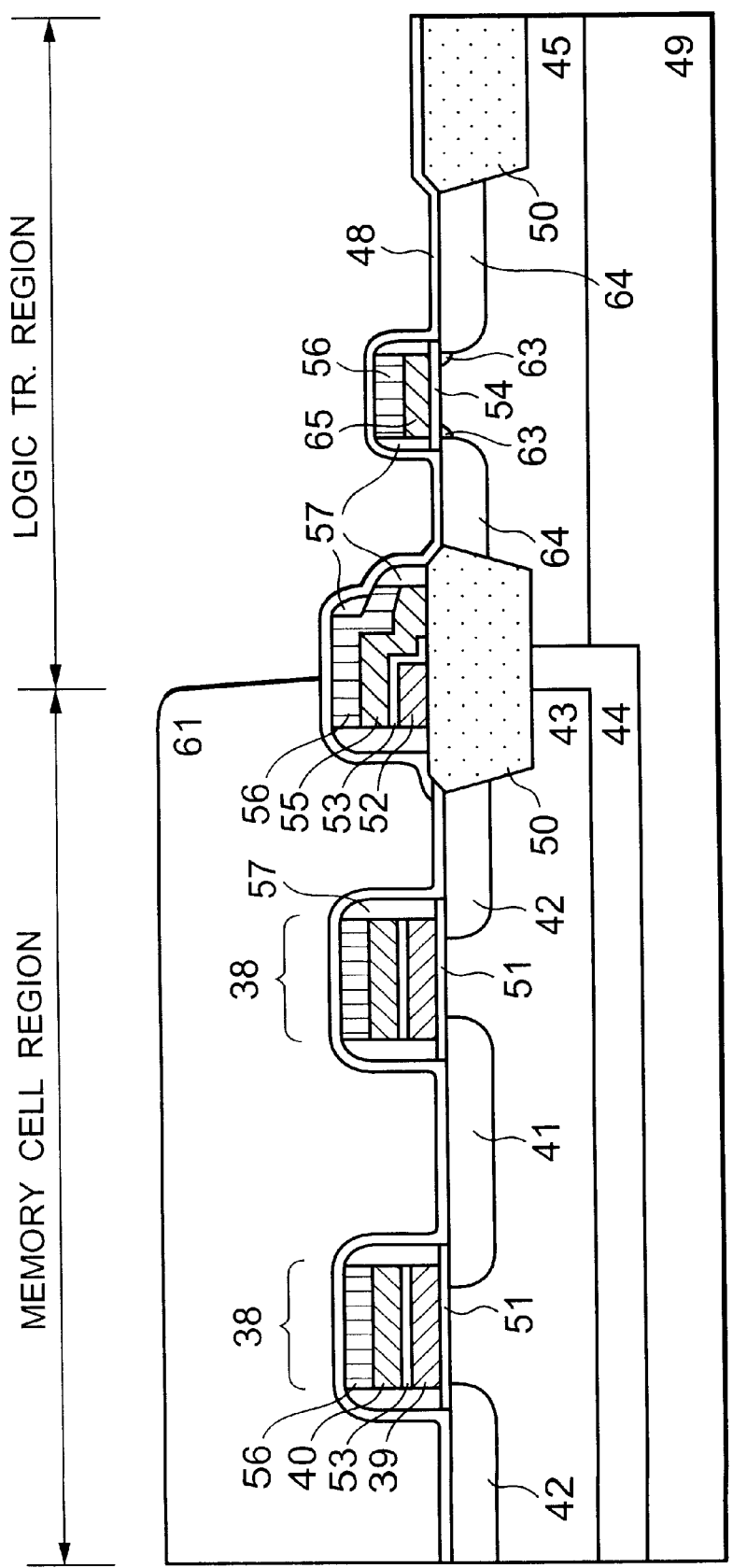
FIG. 29 is a cross sectional view of the process of a conventional technique.
Figure 30:
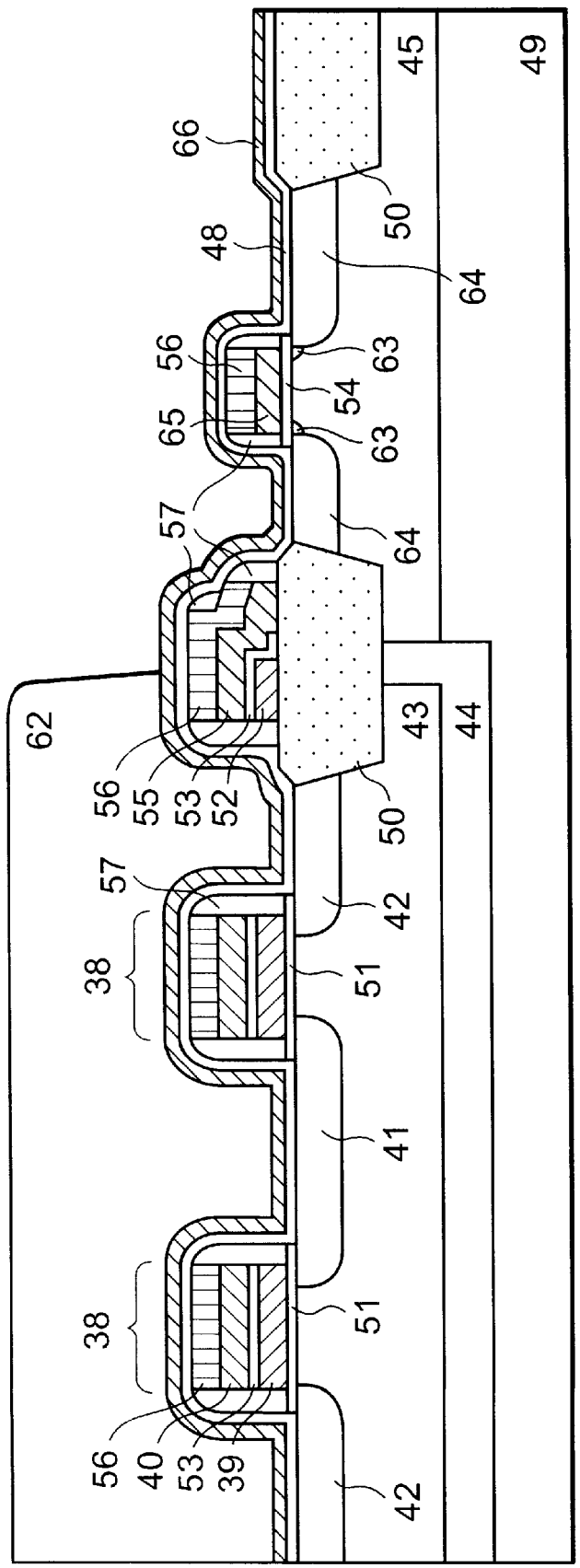
FIG. 30 is a cross sectional view of the process of a conventional technique, in continuation of FIG. 29.
Figure 31:
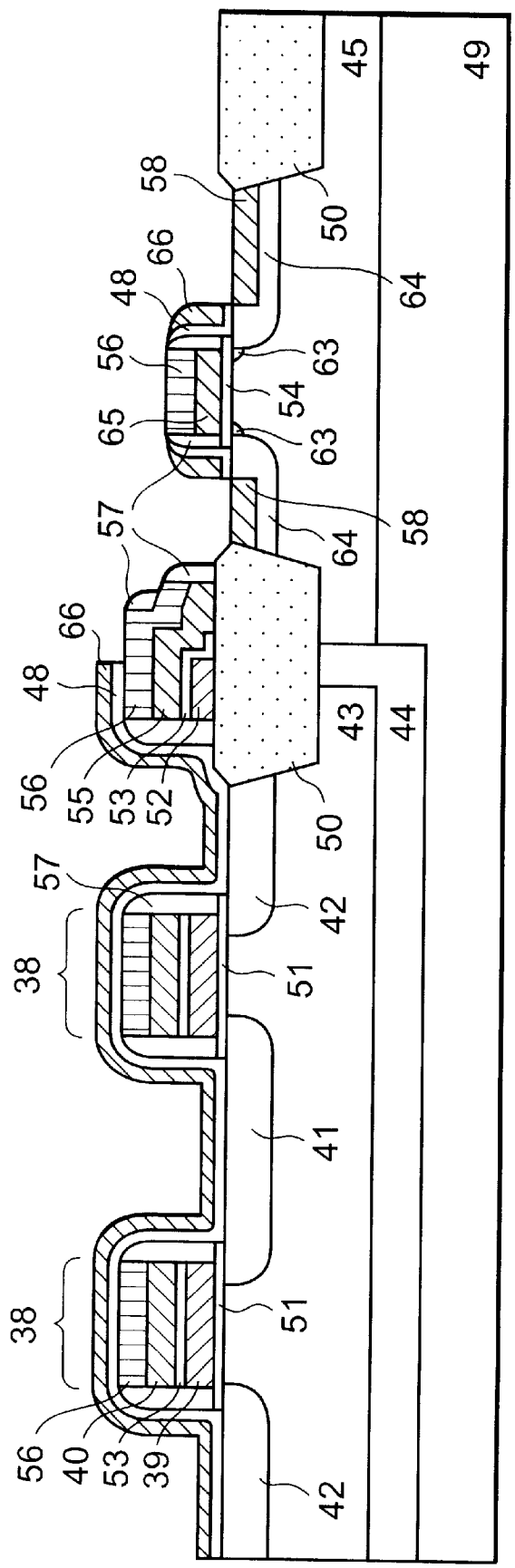
FIG. 31 is a cross sectional view of the process of a conventional technique, in continuation of FIG. 30.

By performing titanium sputtering on the exposed diffusion layer 35 and the source diffusion region 5, titanium is formed on the amorphous diffusion layer 35 and on the amorphous source diffusion region 5. By performing heat treatment, the amorphous diffusion layer 35 and titanium, and the amorphous source diffusion region 5 and titanium, react to form the titanium silicides (TiSi) 25. The drain diffusion region 4 is covered by the LDD HTO film 23 during titanium sputtering, so titanium does not react with silicon, and TiSi is not formed. Afterward, by removing un-reacted titanium by wet etching, etc., only the TiSi 25 can be made to remain, as shown in FIG. 26.

Thus by forming silicide layers, similar to the source and drain of the MOS transistor, in the source diffusion region 5 of the memory cell transistor the surface resistance can be greatly reduced, from several ohms to several hundreds of ohms compared to the conventional, and the memory cell read-out speed can be greatly increased.

The source line resistance can be reduced in Embodiment 2 above, but although the drain line impurity concentration is high, compared with the silicified contacts and the metal wirings, the drain line has a very high resistance.

Embodiment 3 of the present invention, in which the drain line resistance is reduced, is explained below while referring to FIGS. 33 to 38.

The process of forming the double gate of the memory cell transistor of the memory cell region, namely the process from FIG. 2 to FIG. 9, are identical to those of Embodiment 1, so that explanation is omitted.

Figure 33:
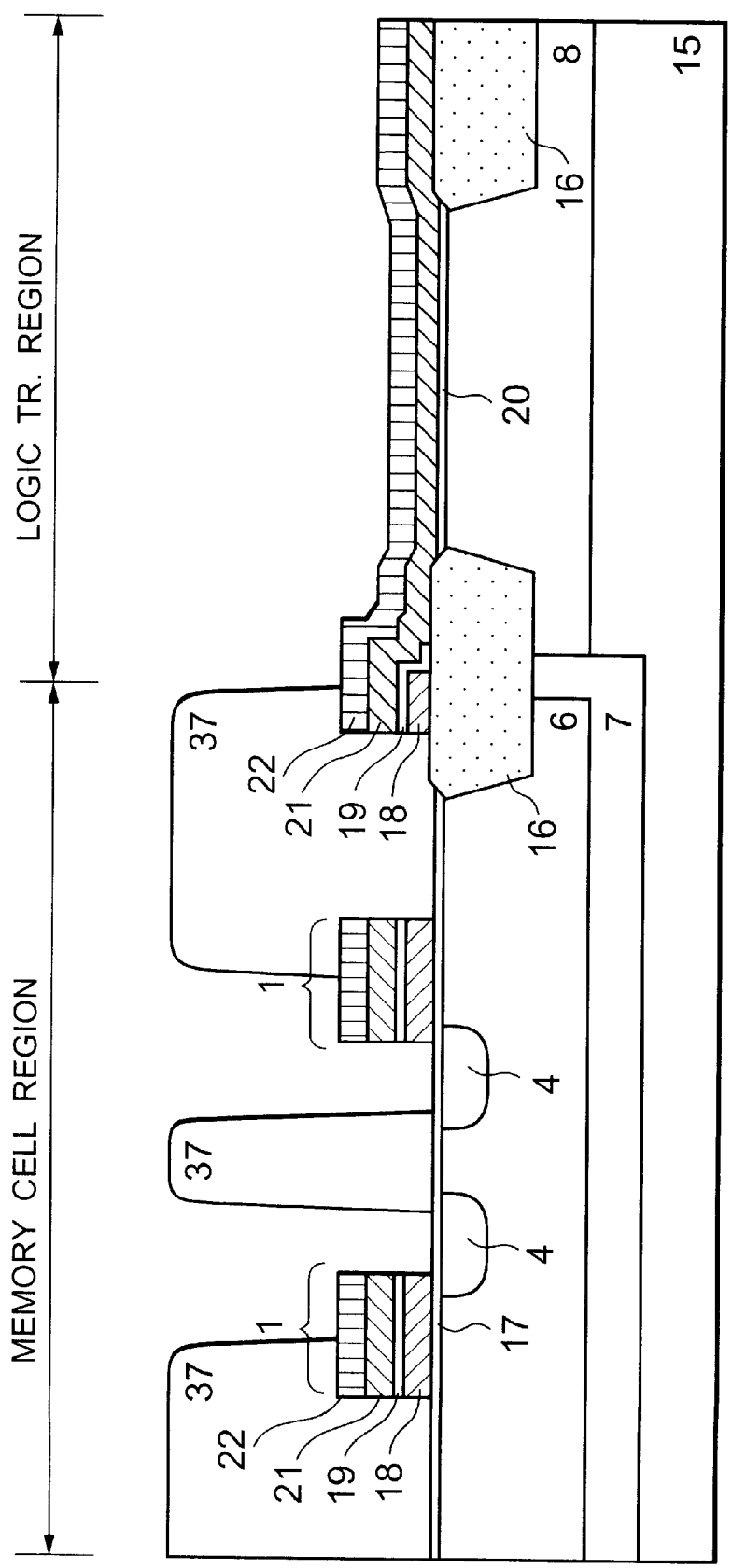
FIG. 33 is a cross sectional view of Embodiment 3 of the present invention.

The double gate is formed in accordance with FIG. 9, and after removing the photoresist 29, the exposed portion of the P-well 6 which becomes the memory cell transistor source, and the exposed portion of the P-well 6 in which a contact is formed to connect the drain and an upper wiring, are each masked by the photoresist 37. Ion injection is performed in the exposed portion of the P-well 6 which becomes the drain, forming the high concentration drain diffusion region 4, as shown in FIG. 33.

Next, the second polysilicon layer 21 and the WSi 22 are selectively etched using a mask, not shown in the figures, in order to form the MOS transistor gate electrode in the logic Tr region.

Figure 34:
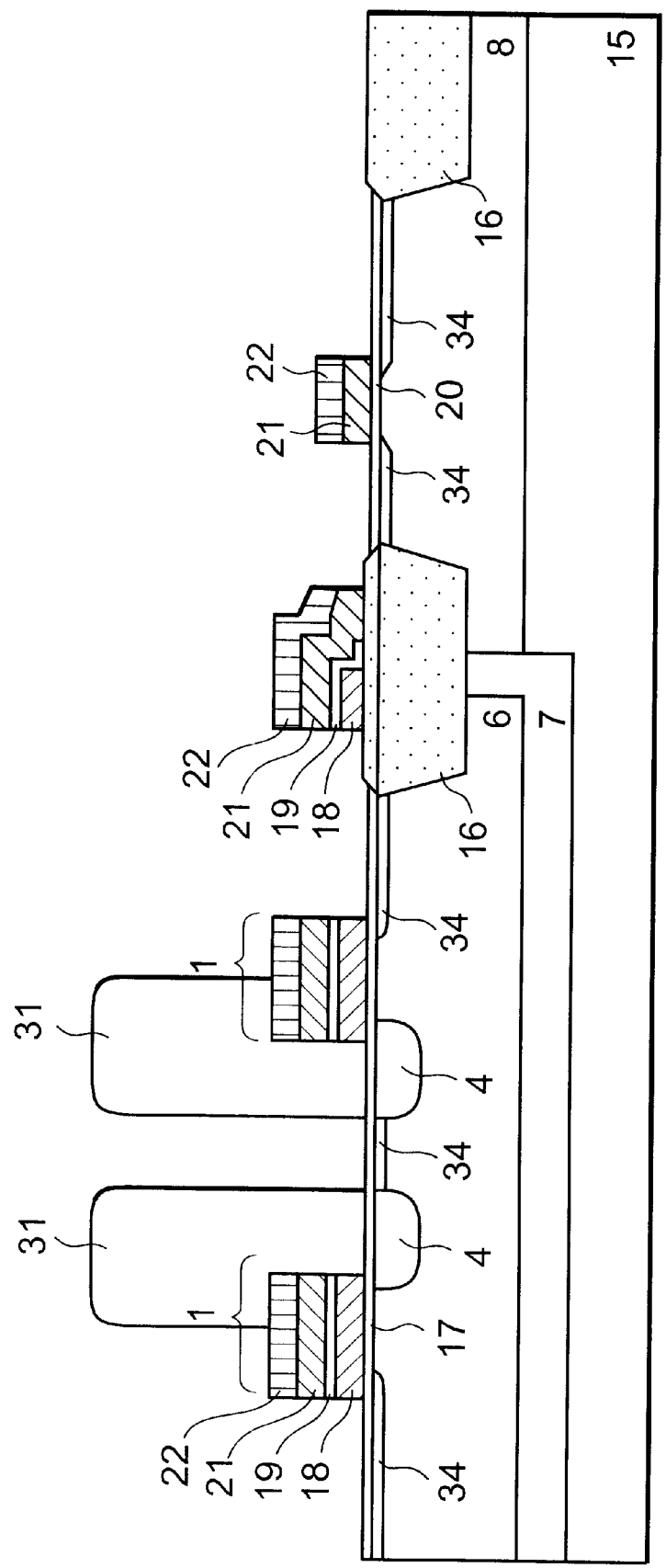
FIG. 34 is a cross sectional view of Embodiment 3 of the present invention, in continuation of FIG. 33.

Afterward, ion injection is performed in order to make the logic Tr region MOS transistor into an LDD structure, but before that the drain diffusion region 4 is covered with the photoresist 31 to protect it from undesirable ion injection. LDD ion injection is performed in the region which becomes the source of the memory cell transistor, in the region which becomes a drain contact, and in the region which becomes the source and drain of the MOS transistor, forming the lightly doped diffusion layers 34, as shown in FIG. 34.

Figure 35:
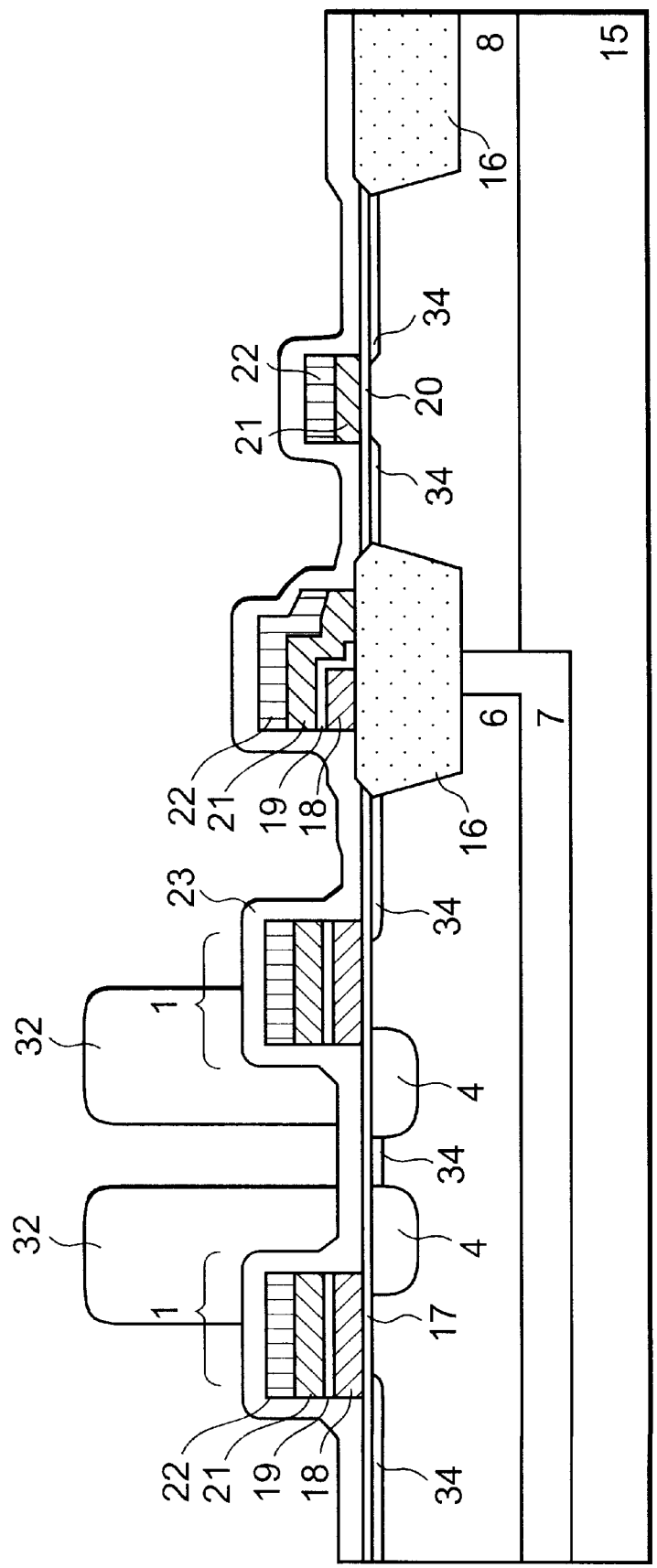
FIG. 35 is a cross sectional view of Embodiment 3 of the present invention, in continuation of FIG. 34.
Figure 36:
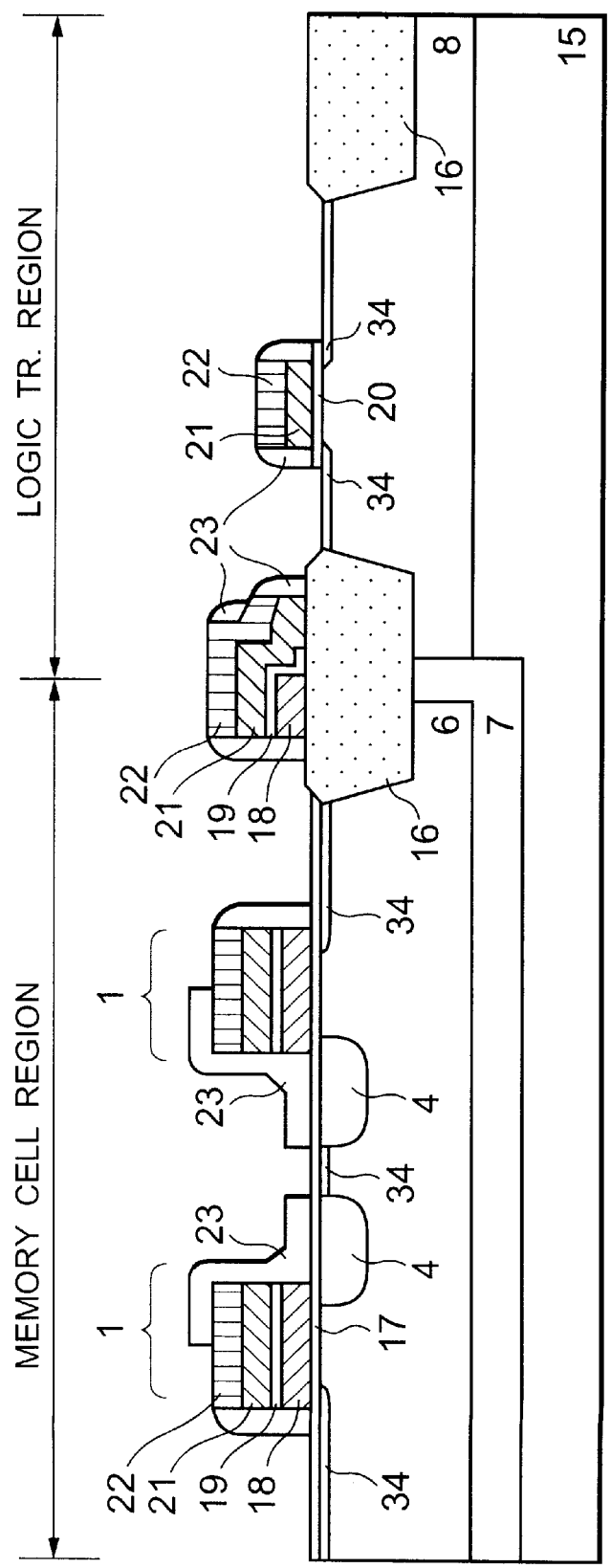
FIG. 36 is a cross sectional view of Embodiment 3 of the present invention, in continuation of FIG. 35.

After peeling off the resist 31, the LDD HTO film 23 is formed over the entire surface to 1000 angstroms, as shown in FIG. 35, the region which must become the drain contact on the drain region 4 of the memory cell transistor is exposed, and the photoresist 32 is selectively formed. The LDD HTO film 23 is selectively etched, with the photoresist 32 as a mask. Sidewalls are formed in the side faces of the MOS transistor in the logic Tr region, while sidewalls are also formed in the side walls of the source side gate electrode of the memory cell transistor not covered by the photoresist 32, as shown in FIG. 36.

Figure 37:
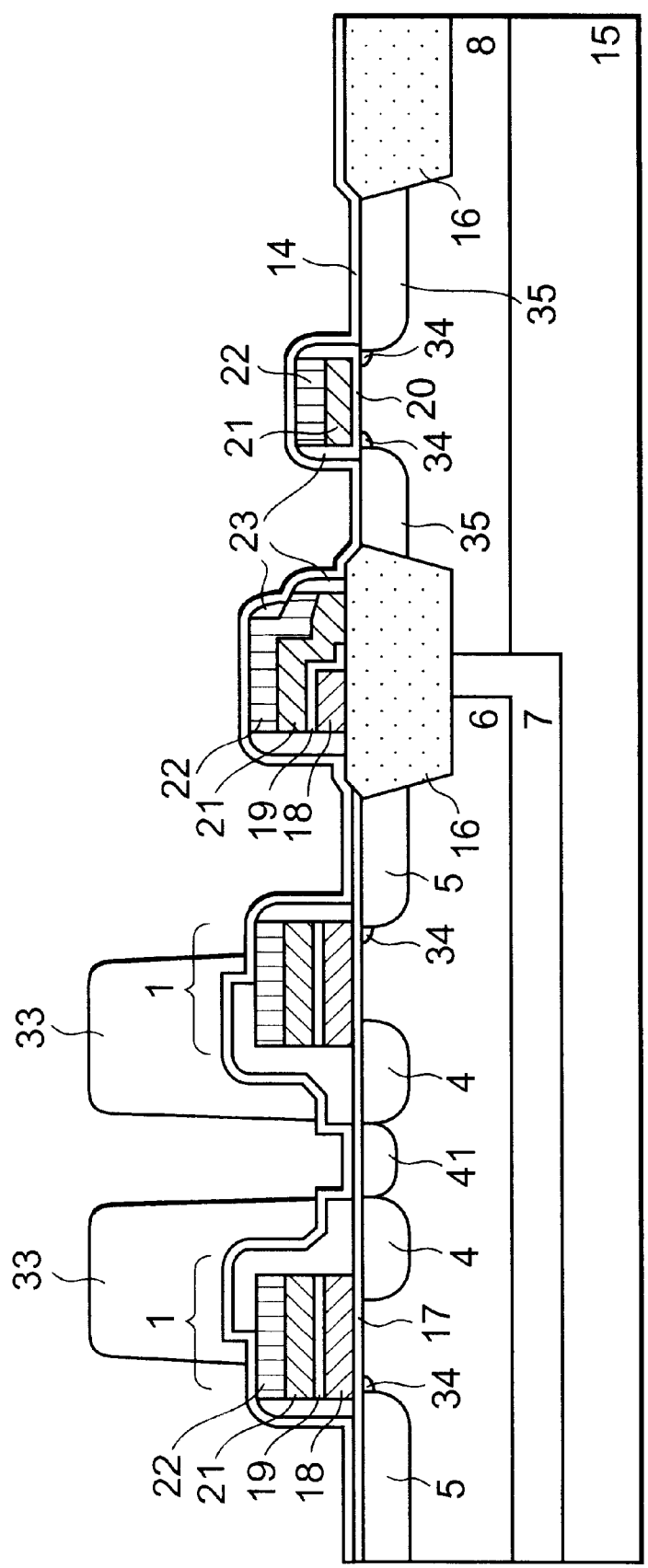
FIG. 37 is a cross sectional view of Embodiment 3 of the present invention, in continuation of FIG. 36.

After peeling off the photoresist 32, the through film 14 is formed over the entire surface for ion injection, while the photoresist 33 is formed so as to be left on the through film 14 only above the drain diffusion region 4 of the memory cell transistor, as shown in FIG. 37. Ion injection is performed with the photoresist 33 as a mask, and the source diffusion region 5 of the memory cell transistor, the drain contact region 41, and the diffusion region 35, which becomes the source and drain of the MOS transistor, are formed.

Next, the photoresist 33 is removed, and a process of making the diffusion layer 35, the drain contact region 41 and the source diffusion region 5 amorphous is performed in order to form a silicide on the diffusion layer 35 of the MOS transistor, on the drain contact region 41 of the memory cell transistor, and on the source diffusion region 5. At this point, the drain diffusion region 4 is protected from the amorphous process by the LDD HTO film 23, similar to Embodiment 2. After the amorphous process is complete, the through film 14 on the diffusion layer 35, on the drain contact region 41, and on the source diffusion region 5 is removed, exposing the diffusion layer 35, the drain contact region 41, and the source diffusion region 5.

Figure 38:
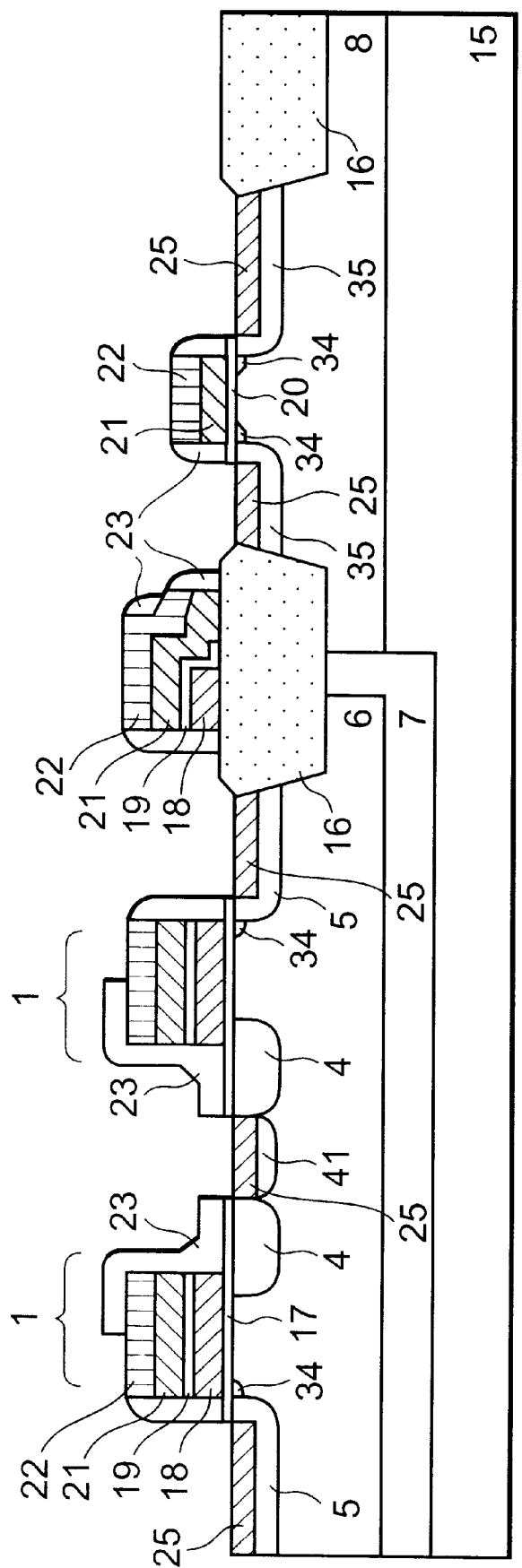
FIG. 38 is a cross sectional view of Embodiment 3 of the present invention, in continuation of FIG. 37.

By performing titanium sputtering on the exposed diffusion layer 35, drain contact region 41, and source diffusion layer 5, titanium is formed on these amorphous regions. By performing heat treatment, titanium and these amorphous regions react to form the titanium suicides (TiSi) 25. The drain diffusion region 4 is covered by the LDD HTO film 23 during titanium sputtering, so titanium does not react with silicon, and TiSi is not formed. Afterward, by removing un-reacted titanium by wet etching, etc., only the TiSi 25 can be made to remain, as shown in FIG. 38.

Thus by silicifying the source diffusion region 5 of the memory cell transistor, similar to the source and drain of the MOS transistor, while also silicifying the drain contact, the surface resistance of the memory cell transistor source and drain lines can both be greatly reduced, by several ohms to several hundreds of ohms compared to the conventional, and the memory cell read-out speed can be additionally increased.

As stated above, by protecting the memory cell region diffusion layer from the silicide formation process, the CMOS transistor source and drain can be silicified without deterioration to the characteristics of the memory cell transistor, and the CMOS transistor response speed can be raised while maintaining the write in speed of the memory cell transistor as is.

What is claimed is:

1. A method of manufacturing a semiconductor device, comprising:

a step of forming a semiconductor substrate having a memory cell region in which a memory cell transistor is formed, and a CMOS logic region in which a CMOS transistor is formed, and of forming a gate electrode used by the memory cell transistor in said memory cell region;

a first impurity injection step of forming a diffusion layer in said memory cell region, with said gate electrode used by the memory cell transistor as a mask;

a step of forming a gate electrode used by the CMOS transistor in said CMOS logic region;

a second impurity injection step of forming a lightly doped drain in said CMOS logic region, with said gate electrode used by the CMOS transistor as a mask;

an insulating film formation step of forming an insulating film covering said memory cell region and said CMOS logic region;

a step of forming a mask layer to cover said memory cell region, excluding said CMOS logic region;

a step of selectively etching said insulating film in correspondence with said mask layer, and forming sidewalls in the side faces of said gate electrode used by the CMOS transistor;

a third impurity injection step of forming a diffusion layer of said CMOS transistor in said CMOS logic region, with said sidewalls as a mask;

a step of depositing a metal on the entire surface after removing said mask layer; and a step of reacting said deposited metal and the exposed diffusion layer of said CMOS transistor to form a metal silicide, wherein the concentration of the impurity injected by said first impurity injection step is higher than the concentration of the impurity injected by said third impurity injection step.

2. A method of manufacturing a semiconductor device, comprising:

a step of forming a semiconductor substrate having a memory cell region in which a memory cell transistor is formed, and a CMOS logic region in which a CMOS transistor is formed, and of forming a gate electrode used by the memory cell transistor in said memory cell region;

a first mask step of selectively masking one region selected from a region in which a source of said memory cell transistor must be formed, and a region in which a drain of said memory cell transistor must be formed;

a first impurity injection step of forming a first diffusion layer in the non-selected region;

a step of removing the mask formed by said first mask step;

a step of forming a gate electrode used by the CMOS transistor in said CMOS logic region;

a second mask step of selectively masking said non-selected region of said memory cell region;

a second impurity injection step of forming a lightly doped drain in said CMOS logic region, with said gate electrode used by the CMOS transistor as a mask, together with forming a lightly doped drain region in said selected region of said memory cell region, with the mask formed by said second mask step as a mask;

a step of removing the mask formed by said second mask step;

an insulating film formation step of forming an insulating film covering said memory cell region and said CMOS logic region;

a step of forming a mask layer to cover said other region of the memory cell region, excluding said CMOS logic region and said selected region of said memory cell region;

a step of selectively etching said insulating film in correspondence to said mask layer, and forming sidewalls in the side faces of said gate electrode used by the CMOS transistor and in one side face of the memory cell transistor;

a third impurity injection step of forming a diffusion layer of said CMOS transistor in said CMOS logic region, and a second diffusion layer of said memory cell transistor in the other region of said memory cell region, with said sidewalls as a mask;

a step of depositing a metal on the entire surface after removing said mask layer; and a step of reacting said deposited metal with the exposed diffusion layer of said CMOS transistor and with said exposed second diffusion layer of the memory cell transistor to form a metal silicide.

3. The method of manufacturing a semiconductor device according to claim 2, wherein the concentration of the impurity injected by said first impurity injection step is higher than the concentration of the impurity injected by said third impurity injection step.

4. The method of manufacturing a semiconductor device according to claim 2, wherein said insulating film formed by said insulating film formation step is an HTO film.

5. The method of manufacturing a semiconductor device according to claim 2, wherein said memory cell transistor is an electrically erasable programmable read-only memory.

6. The method of manufacturing a semiconductor device according to claim 2, wherein the concentration of said first diffusion layer of said memory cell transistor is higher than the concentration of said second diffusion layer.

7. A method of manufacturing a semiconductor device, comprising:

a step of forming a semiconductor substrate having a memory cell region in which a memory cell transistor is formed, and a CMOS logic region in which a CMOS transistor is formed, and of forming a gate electrode used by the memory cell transistor in the memory cell region;

a first mask step of selectively masking a portion of a region in which a drain of said memory cell transistor must be formed;

a first impurity injection step of forming a first diffusion layer in remaining regions, excluding said masked region;

a step of removing the mask formed by said first mask step;

a step of forming a gate electrode used by the CMOS transistor in said CMOS logic region;

a second mask step of selectively masking said remaining regions of said memory cell region;

a second impurity injection step of forming a lightly doped drain in said CMOS logic region, with said gate electrode used by the CMOS transistor as a mask, together with forming a lightly doped drain region in said region of said memory cell region, in correspondence to the mask formed by said second mask step;

a step of removing the mask formed by said second mask step;

an insulating film formation step of forming an insulating film covering said memory cell region and said CMOS logic region;

a step of forming a mask layer to cover said remaining regions of said memory cell region, excluding said CMOS logic region and the region of said memory cell region;

a step of selectively etching said insulating film in correspondence to said mask layer, and forming sidewalls in the side faces of said gate electrode used by the CMOS transistor;

a third impurity injection step of forming a diffusion layer of said CMOS transistor in the CMOS logic region, and a second diffusion layer of the memory cell transistor in said region of said memory cell region, with said sidewalls as a mask;

a step of depositing a metal on the entire surface after removing said mask layer; and a step of reacting said deposited metal with the exposed diffusion layer of said CMOS transistor and with the exposed second diffusion layer of said memory cell transistor to form a metal silicide.

8. The method of manufacturing a semiconductor device according to claim 7, wherein the concentration of the impurity injected by said first impurity injection step is higher than said concentration of said impurity injected by the third impurity injection step.

9. The method of manufacturing a semiconductor device according to claim 7, wherein said insulating film formed by said insulating film formation step is an HTO film.

10. The method of manufacturing a semiconductor device according to claim 7, wherein said memory cell transistor is an electrically erasable programmable read-only memory.

11. The method of manufacturing a semiconductor device according to claim 7, wherein the concentration of said first diffusion layer of said memory cell transistor is higher than the concentration of said second diffusion layer.

12. A method of manufacturing a semiconductor device, comprising:

defining a memory cell region and a logic region on a semiconductor substrate;

forming at least one memory cell transistor in said memory cell region;

forming a gate electrode for a logic transistor over said logic region;

forming an insulating film that includes a first portion covering said memory cell transistor and a second portion covering said gate electrode;

performing an etching-back process on said second portion of said insulating film to form a side-wall on a side surface of said gate electrode without subjecting said first portion of said insulating film to said etching-back process; and forming a metal silicide layer for said logic transistor while leaving said first portion of said insulating film over said memory cell region.

13. The method according to claim 12, wherein said memory transistor comprises an electrically erasable programmable read-only memory.

14. The method according to claim 12, wherein said insulating film comprises a hot thermal oxide (HTO) film.

15. The method according to claim 12, wherein said memory transistor comprises at least one diffusion layer having a concentration higher than a diffusion layer of said logic transistor.

16. The method according to claim 12, further comprising:

forming a lightly doped diffusion layer for said logic transistor by using said gate electrode as a mask before said performing an etching-back process.

17. The method according to claim 16, further comprising:

forming a diffusion layer having a concentration higher than said lightly doped diffusion layer by using said side-wall as a mask after said performing an etching-back process.

* * * * *